US012803212B2

(12) United States Patent
Mindreci et al.

(10) Patent No.: US 12,803,212 B2
(45) Date of Patent: Nov. 17, 2026

(54) SINGLE-PIECE HIGH DATA RATE BACKPLANE CONNECTOR

(71) Applicants: Gaby Cristian Mindreci, Pibrac (FR); MINDREACH I2I, SL, Andorra La Vella (AD)

(72) Inventors: Gaby Cristian Mindreci, Pibrac (FR); Eduard Popsor, Maple (CA)

(73) Assignees: Gaby Cristian Mindreci, Pibrac (FR); MINDREACH I2I, SL, Andorra la Vella (AD)

( * ) Notice: Subject to any disclaimer, the term of this patent is extended or adjusted under 35 U.S.C. 154(b) by 42 days.

(21) Appl. No.: 18/695,377

(22) PCT Filed: Sep. 26, 2022

(86) PCT No.: PCT/IB2022/059139
§ 371 (c)(1),
(2) Date: Mar. 26, 2024

(87) PCT Pub. No.: WO2023/047377
PCT Pub. Date: Mar. 30, 2023

(65) Prior Publication Data

US 2024/0396252 A1 Nov. 28, 2024

(51) Int. Cl.
*H01R 13/453* (2006.01)
*H01R 12/73* (2011.01)
(Continued)

(52) U.S. Cl.
CPC ....... *H01R 13/4538* (2013.01); *H01R 12/737* (2013.01); *H01R 13/62955* (2013.01);
(Continued)

(58) Field of Classification Search
CPC .............. H01R 13/4538; H01R 12/737; H01R 13/62955; H01R 13/639; H01R 13/6587;
(Continued)

(56) References Cited

U.S. PATENT DOCUMENTS 3,651,444 A 3/1972 Desso et al.
10,998,678 B1 * 5/2021 Miller .................. H01R 13/518
(Continued)

FOREIGN PATENT DOCUMENTS

DE 102005003581 A1 7/2006
EP 3399597 A2 11/2018
EP 3399597 B1 5/2021

*Primary Examiner* — Truc T Nguyen
(74) *Attorney, Agent, or Firm* — Jose Cherson Weissbrot

(57) ABSTRACT

This invention describes an improved backplane connector operating at speeds over 25 Gbps including a single-piece configuration that eliminates the insertion point present in 2-gender connectors. As a result, the signal path matches more closely the same path geometry that is found on the daughterboard and on the backplane permitting superior signal integrity and lower losses through the signal transmission line from source to destination. The single-piece backplane connector comprises a protective cover slidably attached over a staggered body assembly. The protective cover comprises a plurality of contact orifices to permit the path through of a corresponding plurality of pin contacts located in a front portion of the staggered body assembly, and at least two guide orifices to permit the path through of at least two corresponding guide pins located in the front portion of the staggered body assembly. The staggered body assembly comprises a plurality of alternating PCB layers and dielectric spacers, wherein the PCB layers include a plurality of traces, wherein each trace electrically connects each of the pin contacts on the front end with a corresponding pin contact on the bottom mating with the corresponding plurality of plated through holes in the daughterboard PCB. Finally, the protective cover further comprises a return spring mechanism to slide from an unpressed position to a pressed position, and the protective cover slides towards the staggered body assembly to permit the pin contacts to protrude through the orifices and to mate with the corre-
(Continued)

sponding plurality of plated through holes in the backplane PCB.

20 Claims, 28 Drawing Sheets

(51) Int. Cl.

| | |
|---|---|
| ***H01R 13/629*** | (2006.01) |
| ***H01R 13/639*** | (2006.01) |
| ***H01R 13/6587*** | (2011.01) |
| ***H01R 13/6594*** | (2011.01) |
| *H05K 1/02* | (2006.01) |

(52) U.S. Cl.
CPC ....... *H01R 13/639* (2013.01); *H01R 13/6587* (2013.01); *H01R 13/6594* (2013.01); *H05K 1/0216* (2013.01); *H05K 2201/044* (2013.01); *H05K 2201/10189* (2013.01)

(58) Field of Classification Search
CPC ............. H01R 13/6594; H05K 1/0216; H05K 2201/044; H05K 2201/10189; H05K 3/366
See application file for complete search history.

(56) References Cited

U.S. PATENT DOCUMENTS

| | | | | |
|---|---|---|---|---|
| 11,031,734 | B1 * | 6/2021 | Miller | H01R 13/6587 |
| 2003/0040202 | A1 * | 2/2003 | Norris | H04Q 1/14 439/76.1 |
| 2005/0101188 | A1 | 5/2005 | Benham et al. | |
| 2013/0330941 | A1 * | 12/2013 | Jeon | H01R 12/585 174/266 |
| 2014/0120770 | A1 * | 5/2014 | Nguyen | H01R 13/6585 439/607.34 |
| 2016/0240946 | A1 * | 8/2016 | Evans | H01R 12/7082 |
| 2017/0025783 | A1 * | 1/2017 | Astbury | H01R 13/514 |
| 2019/0113692 | A1 * | 4/2019 | Yang | G02B 6/3881 |
| 2019/0296469 | A1 * | 9/2019 | Stokoe | H01R 12/716 |
| 2020/0266585 | A1 * | 8/2020 | Paniagua | H01R 12/721 |
| 2023/0387635 | A1 * | 11/2023 | Song | H01R 13/6587 |
| 2024/0313476 | A1 * | 9/2024 | Tuin | H01R 12/585 |
| 2024/0396252 | A1 * | 11/2024 | Mindreci | H01R 13/6587 |

* cited by examiner

SINGLE-PIECE HIGH DATA RATE BACKPLANE CONNECTOR

CROSS REFERENCE TO RELATED APPLICATION

This application claims priority based on U.S. Provisional Application No. 63/248,553, filed Sep. 27, 2021, and U.S. Provisional Application No. 63/284,600 filed on Nov. 30, 2021, which are hereby incorporated by reference in their entirety.

FIELD OF THE INVENTION

This invention relates generally to electrical connectors and more specifically to high-speed backplane connectors systems which are used in telecommunications in industrial, scientific, aerospace and space-flight fields. This single-piece connector is designed to conform with the requirements of Compact PCI Serial Space Specification CPCI-S.1 R1.0 released by PICMG on Aug. 4, 2017.

BACKGROUND

There are several high-speed backplane connector systems known in the State of Art to connect a first printed circuit board or mother board with a second printed circuit board or daughter board. Since electronic components become more reduced and computing power highly scalable, the existing high-speed backplane connectors include several configurations to optimize data transmission.

For example, well-known configurations may include connector systems with a plurality of wafer assemblies defining a mating end and a mounting (or termination) end, where the mating ends include two mating elements generally referred to as male to female or pin to socket, defining a dual connecting interface generally known as a mating pair. In these systems, one mating element's terminations mate with the daughter board and the other mating element's terminations mate with the mother board or backplane. During the connection of daughterboard or daughter card to mother card or backplane, the two elements mate together, and the connection is called an insertion point in the signal transmission line. Consequently, the mechanical and electrical fittings at the insertion point affect the signal path and therefore the signal integrity performance.

SUMMARY OF THE INVENTION

This invention describes an improved daughterboard or daughter card to backplane connector designed to operate at speeds over 25 Gbps comprised into a single-piece or unibody configuration that eliminates the typical male to female or pin to socket insertion point. As a result, the signal path matches more closely the same path geometry that is found on the daughter card and on the backplane permitting superior signal integrity, impedance matching and lower losses through the signal transmission line from source to destination.

Moreover, the single-piece backplane connector includes a guiding and automatically retracting cover which protects the mating pins on the backplane side and aligns them immediately prior to interfacing with the via orifices into the backplane therefore providing an enhanced mechanical fitting. The invention employs materials and features already proven to meet the performance requirements for harsh environments, specifically for space-flight applications according to the European Space Agency's relevant ESCC specifications.

The contact terminations on both sides of the connector are treated with electrodeposited gold finish and for a first embodiment are employing a low-force interface design known as "the twist-pin" allowing the terminations to be rated at over 200 low-force insertion-removal cycles preserving gold plating integrity on both termination and via wall, and further eliminating any concern for deformation or stress into the metallized via and surrounding printed circuit board material.

For a second embodiment, the contact terminations on both sides of the connector are also treated with electrodeposited gold finish and are employing an interface design known as Slide-Fit Electrical Contact Termination Technology based on U.S. Provisional Application No. 63/284,600, which is hereby incorporated by reference in its entirety.

The entire connector in both embodiments, in accordance with the present invention, is FFF (fit, form, function) compliant with the compact PCI Serial architecture therefore backward compatible allowing for quick integration and deployment in current applications.

BRIEF DESCRIPTION OF THE DRAWINGS

The accompanying drawings are not intended to be drawn to scale. In the drawings.

DETAILED DESCRIPTION

Figure 1:
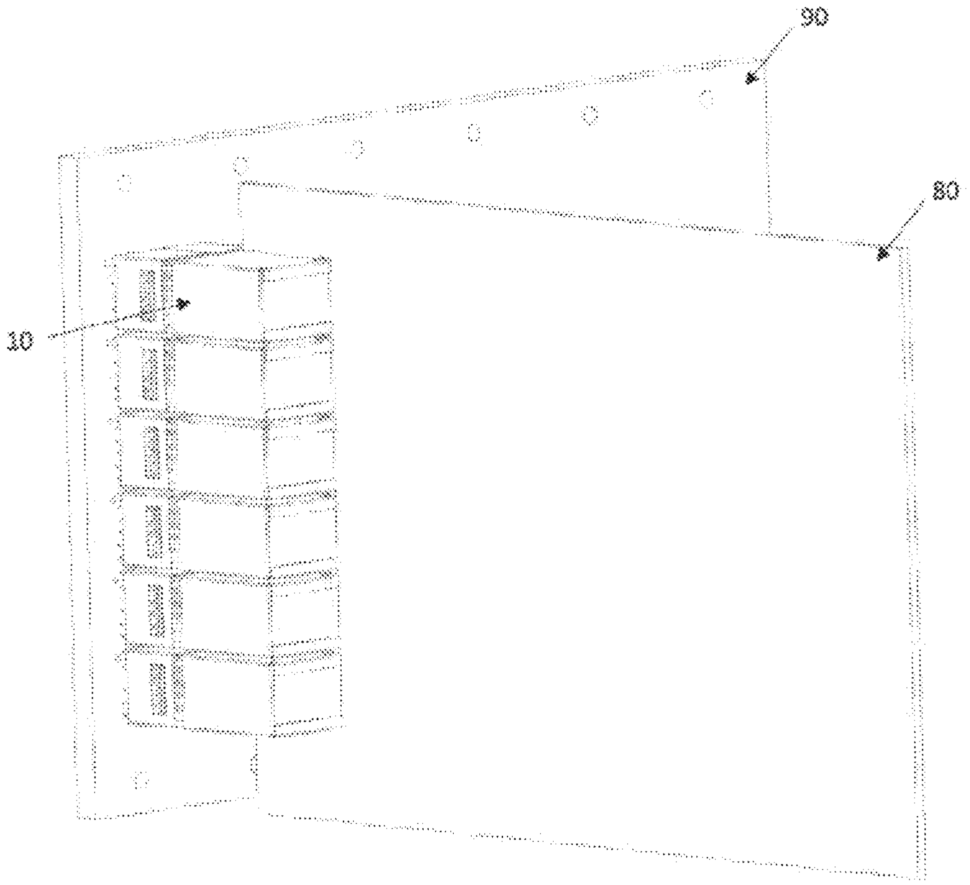
FIG. 1 is a perspective view showing exemplary six single-piece backplane connectors, in accordance with a first embodiment of the present invention, in a daughterboard to backplane connection system illustrating an environment in which the invention may be applied.

Embodiments of a single-piece high data rate backplane connector, and system are described herein. In the following description numerous specific details are set forth to provide a thorough understanding of the embodiments. However, a person skilled in the relevant art will recognize that the techniques described herein can be practiced without one or more of the specific details, or with other components, materials, etc.

In the sake of clarity, a reference description of each numbered technical feature or element from the figures can be found in the following table 1:

TABLE 1 number references in figures

| Number | Description |
|---|---|
| 10 | Single-piece backplane connector (first embodiment) |
| 20 | Protective sliding cover |
| 21 | Pin contact orifice |
| 21a | Cylindrical portion of pin orifice |
| 21b | Conical portion of pin orifice |
| 23 | Guide orifice |
| 25 | Rear face of the protective sliding cover |
| 26 | Top face of the protective sliding cover |
| 27 | Integrated spring clip |
| 28 | Bottom face of the protective sliding cover |
| 29 | Front face of the protective sliding cover |
| 31 | Flat surface |
| 40 | EMI shielding housing |
| 43 | First lateral wall of the EMI shielding housing |
| 44 | Second lateral wall of the EMI shielding housing |
| 45 | Installation orifice of the EMI shielding housing |
| 46 | Top surface of the EMI shielding housing |
| 48 | Shield tail of the EMI shielding housing |
| 49 | Rear wall of the EMI shielding housing |
| 50 | Staggered body assembly |
| 51 | Frontal portion of the staggered body assembly |
| 52 | Alternating offset arrangement of the twist pin contact on the daughterboard side |
| 55 | Installation orifice of the staggered body assembly |
| 57 | Top and bottom groove of the staggered body assembly |
| 58 | Rear portion of the staggered body assembly |
| 60 | PCB layer |
| 61 | Twist pin contact on the backplane side |
| 65 | PCB trace |
| 68 | Twist pin contact on the daughterboard side |
| 70 | Dielectric spacers |

TABLE 1-continued number references in figures

| Number | Description |
|---|---|
| 71 | Plurality of slots backplane side |
| 73 | Guide pin |
| 78 | Plurality of slots daughterboard side |
| 80 | Daughterboard PCB |
| 80a | Rounded edge of the daughterboard PCB (second embodiment) |
| 81 | Plated through holes in the daughterboard PCB |
| 90 | Backplane PCB |
| 91 | Plated through holes in the backplane PCB |
| 93 | Guiding orifices in the backplane PCB |
| 110 | Single-piece backplane connector with 6 rows of contacts (second embodiment) |
| 111 | Single-piece backplane connector with 8 rows of contacts (second embodiment) |
| 120 | Protective slide-fit cover |
| 121 | Slide-fit contact orifice |
| 121a | Elastic deformation zone of the slide-fit contact orifice |
| 122 | Grounding tab |
| 123 | Oval guide orifice |
| 124 | Locking tab for the protective slide-fit cover |
| 125 | Rear face of the protective slide-fit cover |
| 126 | Top face of the protective slide-fit cover |
| 127 | Return spring |
| 129 | Front face of the protective slide-fit cover |
| 131 | Flat dielectric surface |
| 132 | Locking screw |
| 133 | Locking hinge |
| 134 | Locking lever |
| 134a | Tip curvature of the locking lever |
| 135 | Hinge pin |
| 136 | Locking screw base |
| 137 | Spring clip |
| 138 | Housing for the locking lever |
| 139 | Dielectric spacer |
| 150 | Staggered body assembly |
| 153 | Front face of the staggered body assembly |
| 154 | Bottom of the staggered body assembly |
| 155 | Installation orifices |
| 156 | Return spring housing |
| 159a | Spring clip external fold |
| 159b | Spring clip internal fold |
| 159c | Overlapping cut-out |
| 161 | Slide-fit contact on the backplane side |
| 155 | Installation orifice of the staggered body assembly |
| 168 | Slide-fit contact on the daughterboard side |
| 173 | Guide pin |
| 174 | Offset pin |
| 180 | End spacer |
| 181 | Ground plane laminated on the end spacer |
| 182 | PCB |
| 194 | Offset guiding orifice for offset pin |
| 195 | Dielectric offsetting plate |

The single-piece backplane connector in accordance with a first embodiment of the present invention include the relevant technical features as listed below: FIG. 1 is a perspective view showing six single-piece backplane connectors (10) in accordance with a first embodiment of the present invention. Each of the single-piece backplane connectors (10) mates directly in self-aligning blind mating operation with a backplane PCB (90) in its front end, hereby referred as "backplane side"; and mates directly with a daughterboard PCB (80) in its bottom, hereby referred as "daughterboard side". Generally, the single-piece backplane connectors (10) are inserted into and extracted from the backplane PCB (90) with certain cycling frequency, while the attachment to the daughterboard PCB (80) is generally maintained since original installation. However, the special characteristics of this invention permit multiple installation and removal cycles onto the daughterboard PCB (80) without damaging plated through holes, allowing the connector to be reusable or recyclable. The backplane PCB (90) and the daughterboard PCB (80) are well-known components of the state of the art.

As illustrated in FIGS. 2A to 3B, the single-piece backplane connector (10) comprises a protective sliding cover (20), an EMI shielding housing (40), and a staggered body assembly (50). The sliding cover (20) slidably attaches and protects a front portion of the staggered body assembly (50), while the EMI shielding housing (40) fixedly protects a rear portion of the staggered body assembly (50).

The protective sliding cover (20) has a front face (29) comprising a plurality of pin contact orifices (21) and at least two guide orifices (23). In the illustrated embodiment, the pin orifices (21) are conformed by a cylindrical portion (21*a*) in the front face (29) and a conical portion (21*b*) in the rear face (25) of the protective sliding cover (20), as can be better observed in FIGS. 7A and 7B and will be explained in detail further in this description. In addition, the top face (26) of the sliding cover and the bottom face (28) of the sliding cover include an integrated spring clip (27) to allow the protective sliding cover (20) to return from a pressed position to a protected unpressed or disconnected position, as will be explained later in this description. Each of the plurality of pin orifices (21) permit the path through of a corresponding plurality of twist pin contacts (61) located in the front portion of the staggered body assembly (50). Similarly, at least two guide orifices (23) permit the path through of at least two corresponding guide pins (73) located in the front portion of the staggered body assembly (50) wherein the at least two guide pins (73) align the single-piece backplane connector (10) with the backplane PCB (90) during bling-mating engagement.

Moreover, as illustrated in FIGS. 2A to 3B, the EMI Shielding housing (40) of the single-piece connector (10) preferably comprises a top surface (46), a rear wall (49) and two lateral walls (43, 44). Each of the lateral walls (43, 44) is extended into the daughterboard side by at least one shield tail (48) and at least one installation orifice (45). In the illustrated embodiment, the EMI Shielding housing (40) has four installation orifices (45) and four staggered shield tails (48) to fully separate the mechanical function from the electrical function of the device during the mating action and during the operation of the equipment. The separation of the mechanical function from the electrical function ensures that no mechanical stress is imparted to the contacts whose function remain only as electrical connections. The four shield tails (48) allow the transfer of mechanical load during the insertion and extraction of the daughterboard PCB (80) and therefore effectively relieving mechanical load to the electrical contacts allowing the contacts to perform only the electrical function.

As depicted in FIGS. 3A to 5, the single-piece backplane connector (10) includes the staggered body assembly (50) which is a wafer assembly of connector body built from a plurality of alternating PCB layers (60) and dielectric spacers (70). Each of the PCB layers (60) and dielectric spacers (70) include at least one installation orifice (55) to support the assembly. Also, each of the PCB layers (60) and dielectric spacers (70) is outlined to define a frontal portion (51) and a rear portion (58), as indicated in FIG. 4A. In the illustrated embodiment, each of the PCB layers (60) and dielectric spacers (70) has four installation orifices (55). In addition, in the illustrated embodiment, the frontal portion (51) include a top and bottom groove (57) to interact with the integrated spring clip (27). Moreover, at least two of the dielectric spacers (70) include the corresponding at least two guide pins (73) on the backplane side.

Figure 4A:
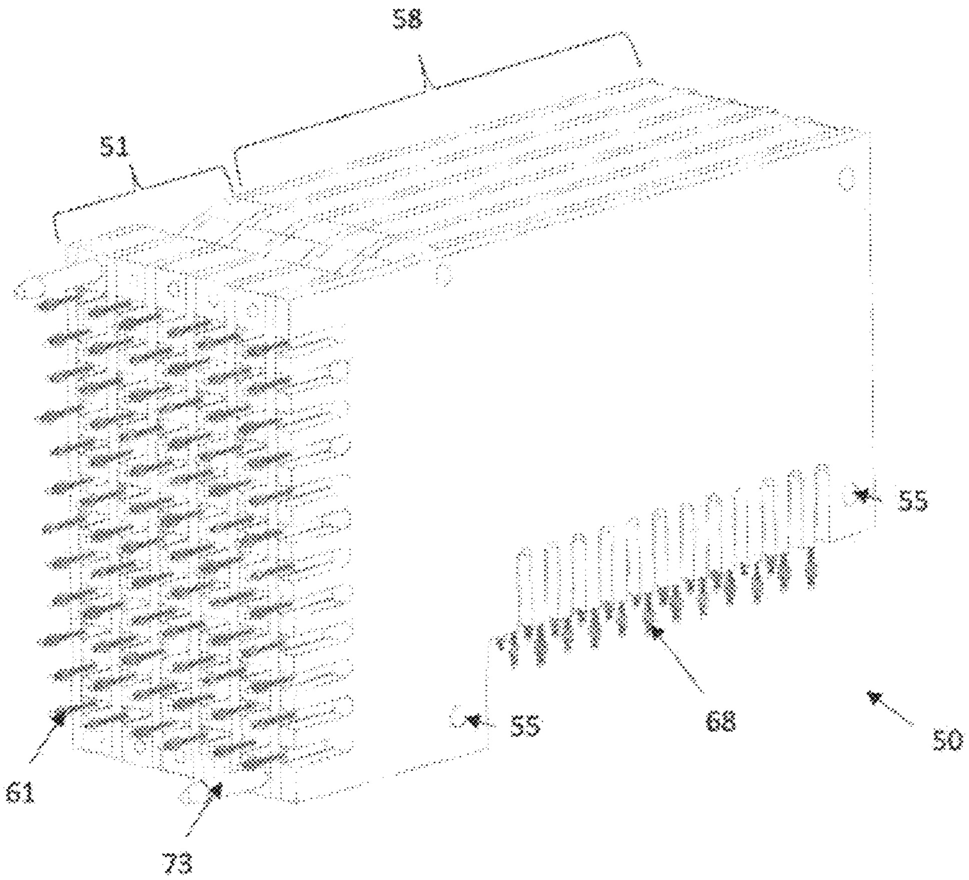
FIG. 4A is a perspective view of the staggered body assembly of the single-piece backplane connector, in accordance with a first embodiment of the present invention.
Figure 4B:
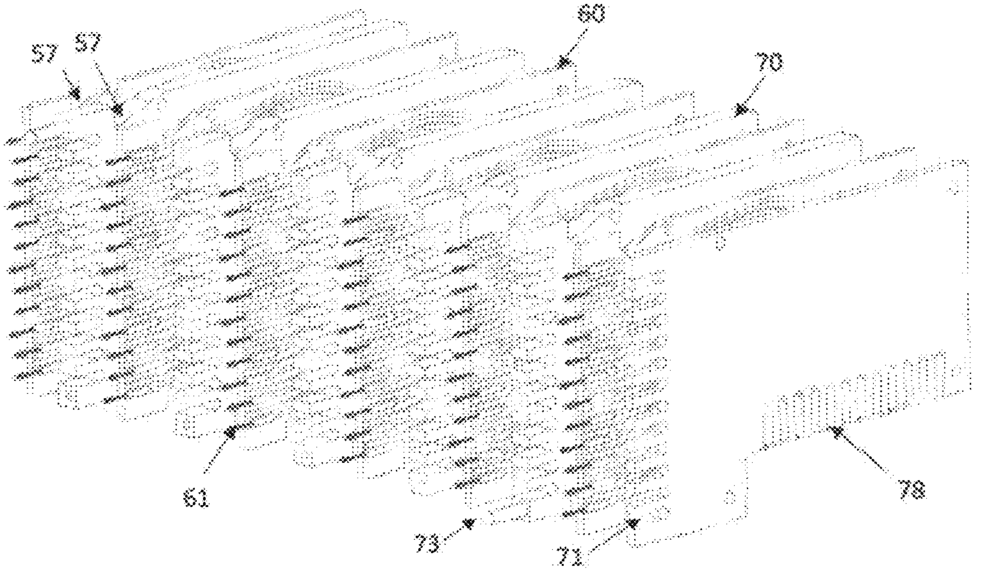
FIG. 4B is an exploded view of the staggered body assembly of the single-piece backplane connector, in accordance with a first embodiment of the present invention.
Figure 5:
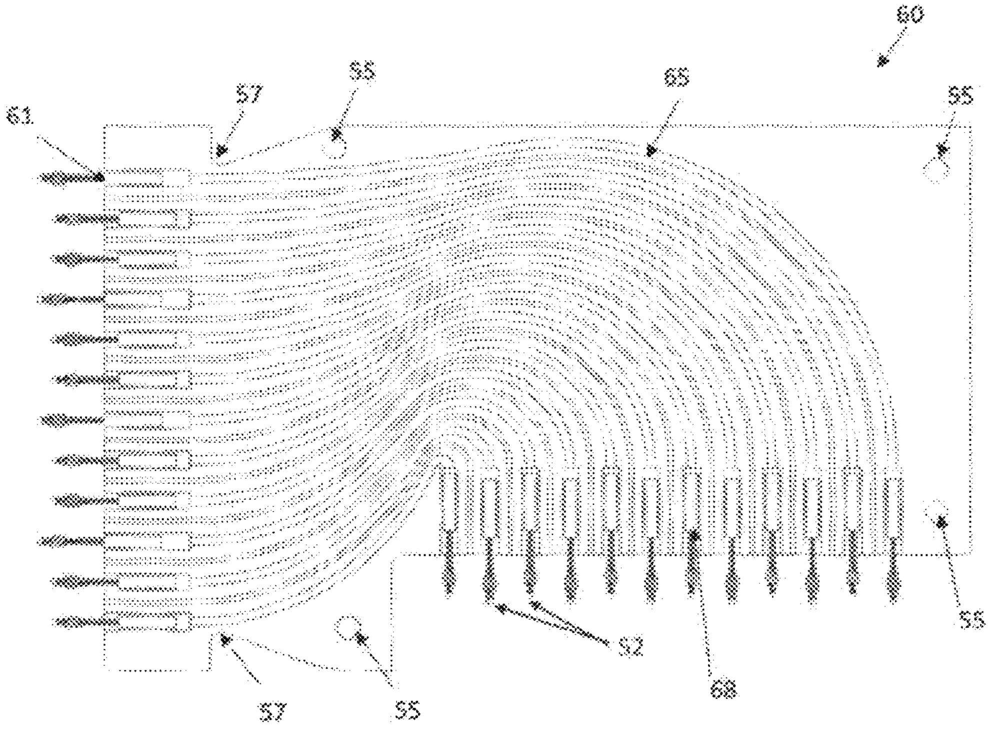
FIG. 5 is a side view of the staggered body assembly of the single-piece backplane connector, in accordance with a first embodiment of the present invention.
Figure 6A:
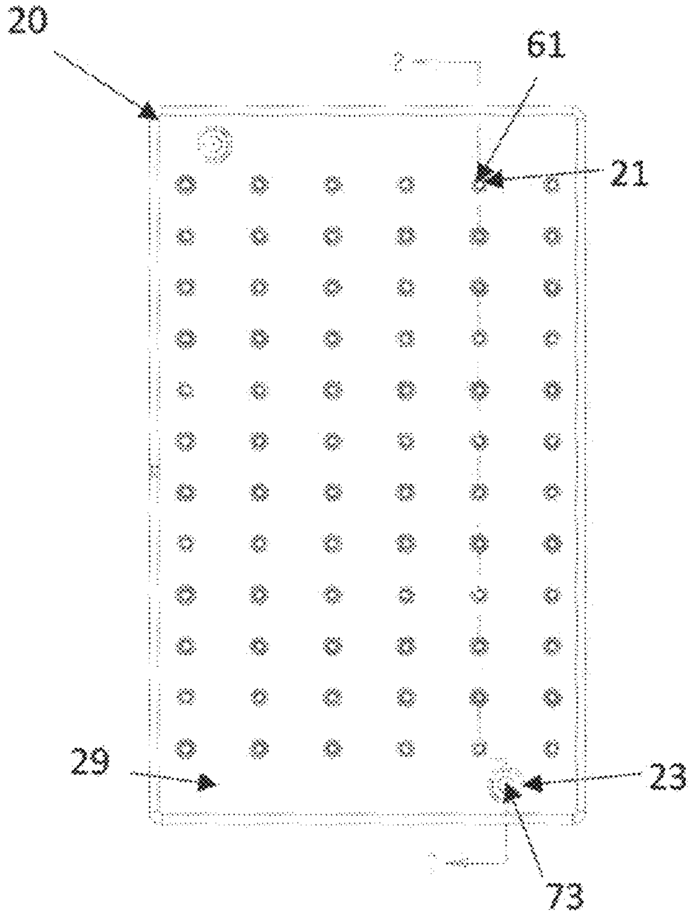
FIG. 6A is a front view of the single-piece backplane connector, in accordance with a first embodiment of the present invention.
Figure 6B:
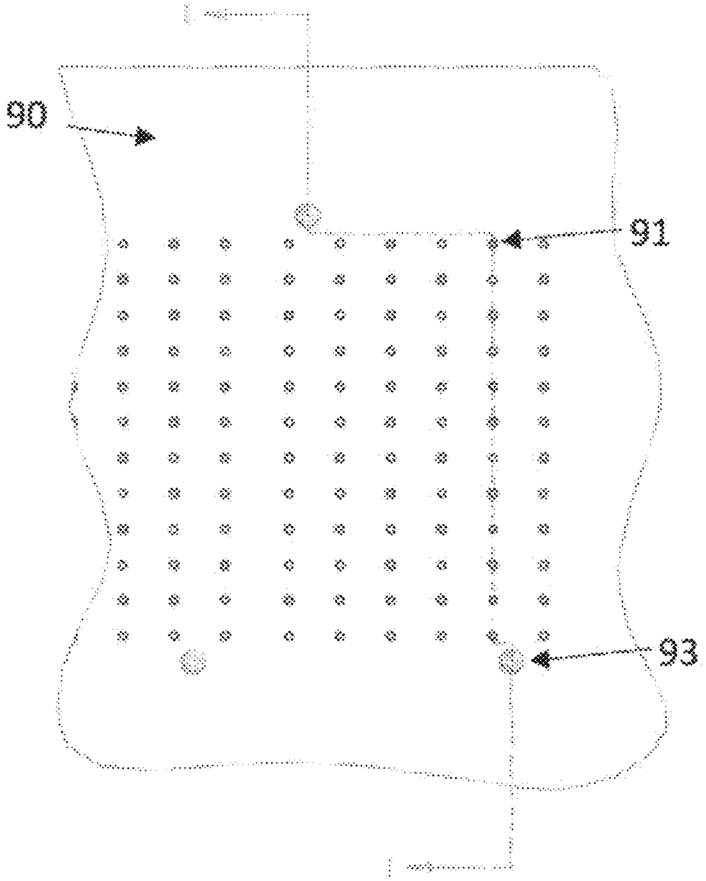
FIG. 6B is a front view of a portion of the backplane mating with the single-piece backplane connector, in accordance with a first embodiment of the present invention.
Figure 8A:
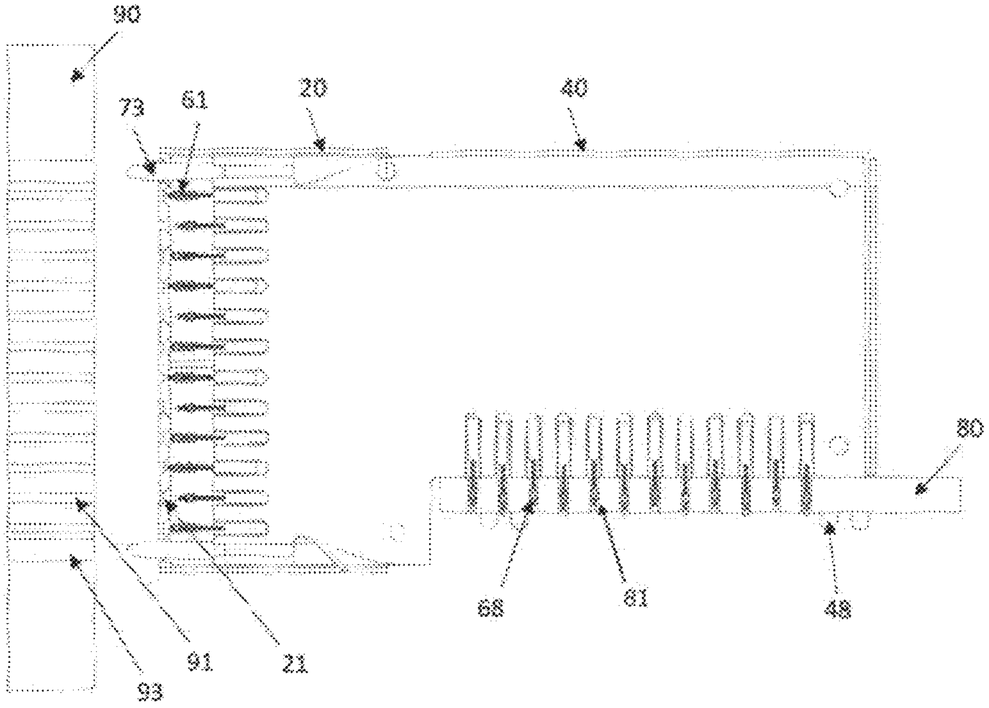
FIG. 8A is a cross-sectional representation of the portion of the backplane mating with the single-piece backplane connector illustrated in FIG. 6B, taken along the line I-I with the sliding cover, before mating and the sliding cover in an unpressed position.
Figure 8B:
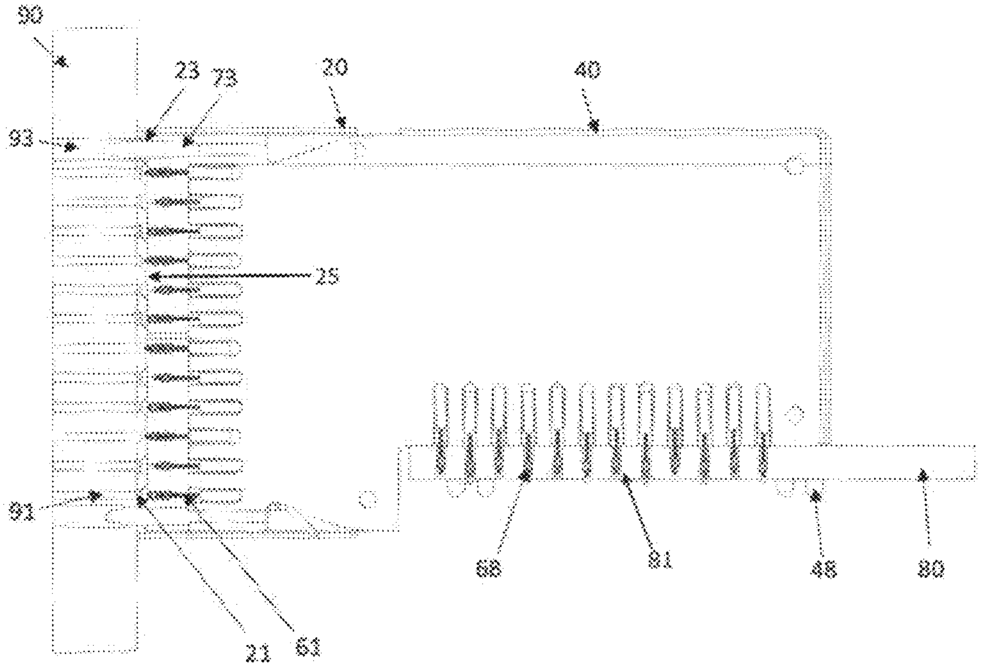
FIG. 8B is a cross-sectional representation of the portion of the backplane mating with the single-piece backplane connector illustrated in FIG. 6B, taken along the line I-I with the sliding cover, starting to mate and the sliding cover in an unpressed position.
Figure 8C:
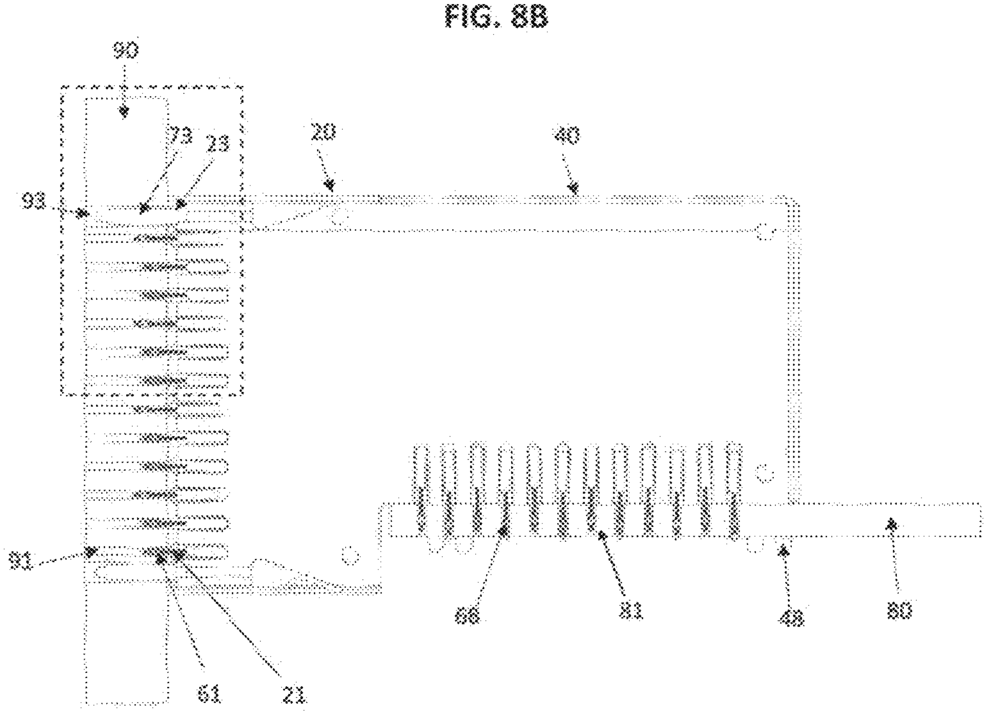
FIG. 8C is a cross-sectional representation of the portion of the backplane mating with the single-piece backplane connector illustrated in FIG. 6B, taken along the line I-I with the sliding cover, with a complete mating and the sliding cover in a pressed position.
Figure 8D:
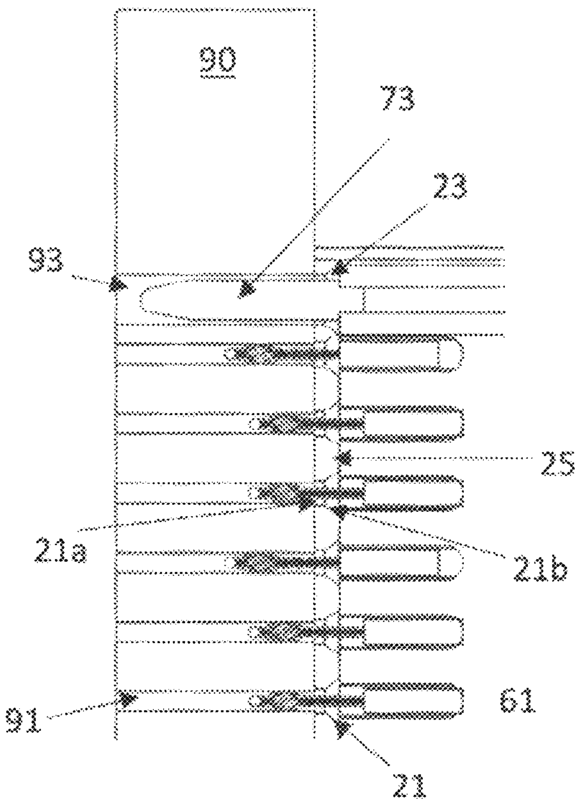
FIG. 8D is an enlarged detail view of the area selected in FIG. 8C of the twist pins used in the manufacture of the single-piece backplane connector, in accordance with one embodiment of the present invention.

Referring to FIG. 5, each of the PCB layers (60) has a plurality of traces (65), wherein each trace (65) electrically connects each twist pin contact (61) on the backplane side with a corresponding twist pin contact (68) on the daughterboard side. The preferred embodiment of the invention includes an alternating offset arrangement (52) of the twist pin contacts (68) on the daughterboard side to shift the piercing moment for 50% of the twist pin contacts (68) during the press-fit application, therefore effectively reducing the total insertion force of the device into the daughterboard PCB (80). Moreover, as illustrated in FIG. 4B, each of the dielectric spacers (70) include a plurality of slots (71) on the backplane side and a plurality of slots (78) on the daughterboard side, each one corresponding to the position of each twist pin contact (61, 68) on both the backplane side and daughterboard side. The selected twist pin contact configuration of pin contacts (61) and (68) represent one embodiment of the invention, however the contacts tip interface geometry may employ different configurations to achieve reliable electrical contact with a plurality of plated through holes (81) in the daughterboard PCB (80) and a plurality of plated through holes (91) backplane PCB (90), as shown in FIGS. 8A to 8C. The combination of the construction shown in FIGS. 4B and 5, within the same assembly of PCB layers (60) with contact pins (61, 68) welded on both ends of PCB traces (65) and separated by dielectric spacers (70) to assure alignment and isolation, is a construction arrangement employed for the first time to allow the creation of a direct PCB-to-PCB connector body utilizing a completely novel method in contrast to the existing technologies where molded insulators house individual contacts routed through cavities. It should be considered within the scope of this invention that configurations of the traces (65) within the PCB layers (60) may vary depending on technical requirements of the connector.

FIGS. 8A to 8D show the process of blind mating the connector assembled on the daughterboard PCB (80) with the footprint in the backplane PCB (90). In FIG. 8B the at least two guide pins (73) align the connector with the backplane during the insertion process which takes place from right to left of the image. The at least two guide pins (73) help preventing the sliding cover (20) to start moving backwards unless they find at least two corresponding guiding orifices (93) in the backplane PCB (90). The guide pins (73) fully align the connector assembled on the daughterboard PCB (80) with the backplane PCB (90), so that the front face (29) of the protective sliding cover (20) makes a flat connection with the surface of the backplane PCB (90), and only when in correct position it starts sliding towards the body of the single-piece connector (10) permitting the twist pin contacts (61) to protrude through the pin orifices (21) and start mating with the corresponding plurality of plated through holes (91) in the backplane PCB (90). In addition, the rear face (25) of the protective sliding cover (20) employs the conical portion (21*b*) to assure a second level of precision guiding for each individual twist pin contact (61) to prevent the stubbing of the contacts. This second level of alignment for the contacts is an innovative feature never employed in prior art pertaining to the blind-mating operation of electrical connectors.

Figure 7A:
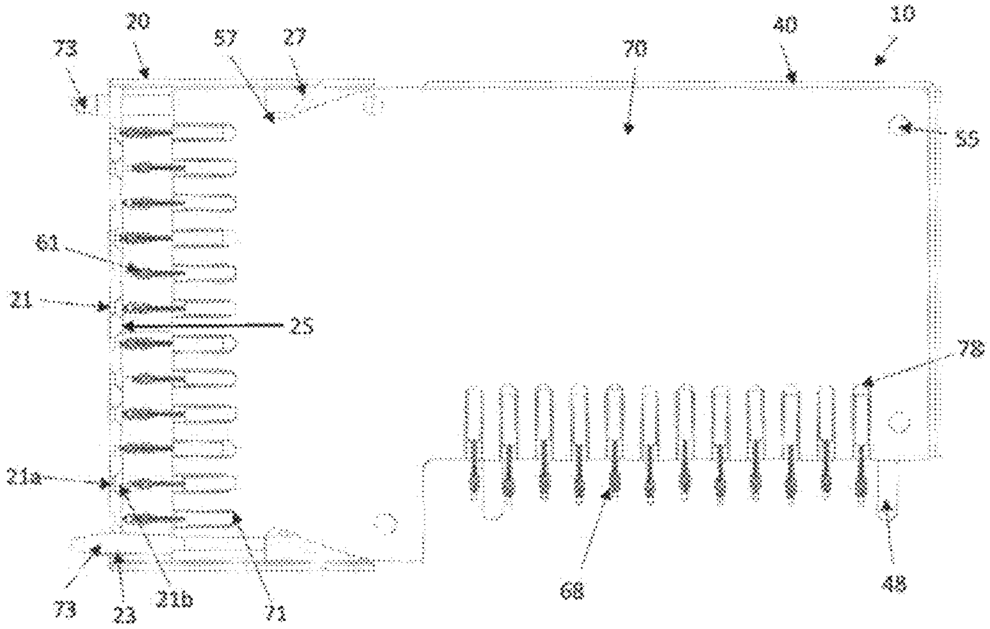
FIG. 7A is a cross-sectional representation of the single-piece backplane connector illustrated in FIG. 6A, taken along the line 2-2 with the sliding cover in an unpressed position with the cover in the active protection position.
Figure 7B:
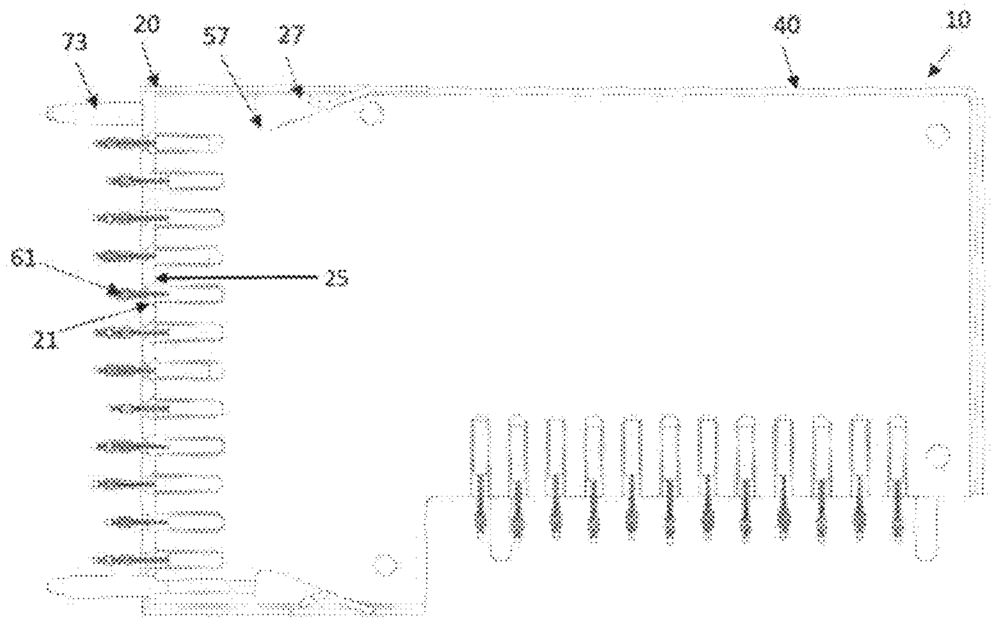
FIG. 7B is a cross-sectional representation of the single-piece backplane connector illustrated in FIG. 6A, taken along the line 2-2 with the sliding cover in a pressed or connected position.

As described in FIGS. 7A and 7B, the present invention also includes an automatic return mechanism on the protective sliding cover (20) with the integrated spring (27). Preferably, the shield which contains the spring is manufactured in beryllium-copper due to the good elastic properties of the material. The integrated top and bottom spring clips (27) ensure that the protective sliding cover (20) automatically returns in the disconnected position which fully protects the twist pin contacts (61) by shrouding them completely when the connector is uncoupled from the backplane PCB (90).

Figure 2A:
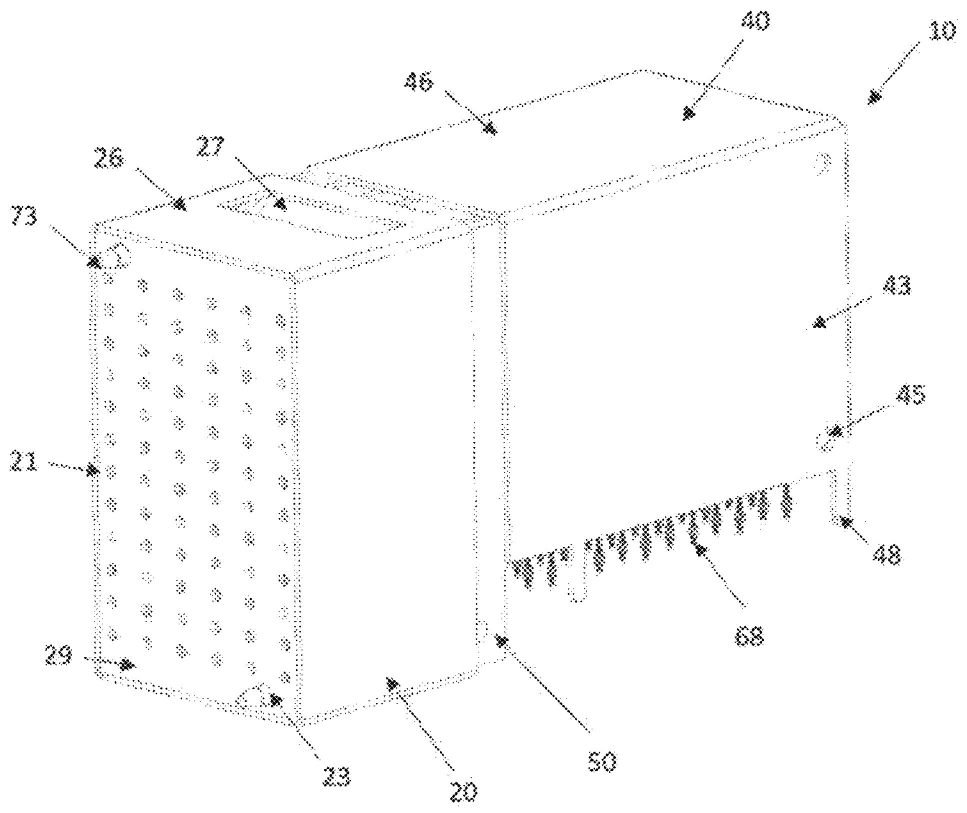
FIGS. 2A and 2B are perspective views of the single-piece backplane connector in accordance with a first embodiment of the present invention, in an unpressed position, where only the pins on the daughterboard side are visible and the pins on the backplane side are hidden by the protective cover.
Figure 2B:
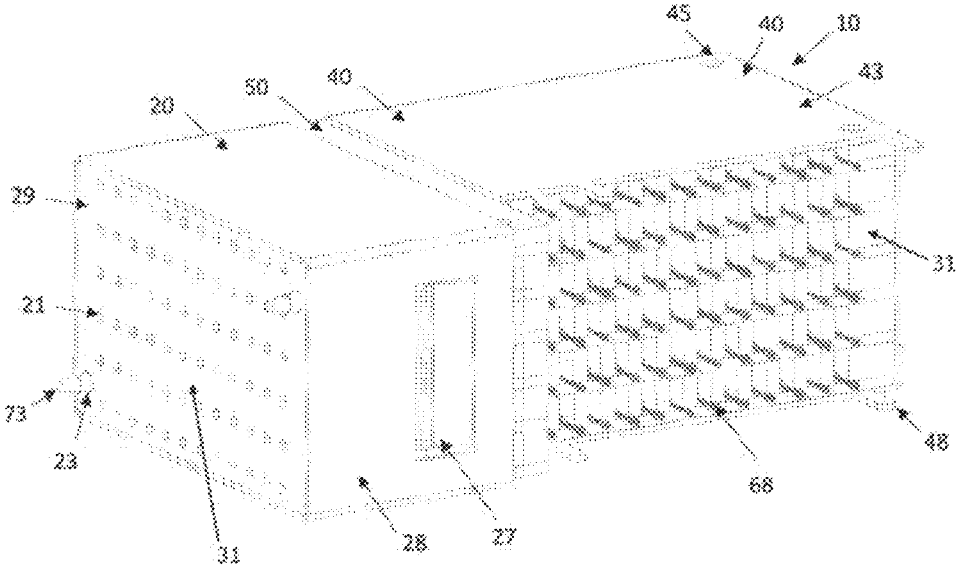
Figure 3A:
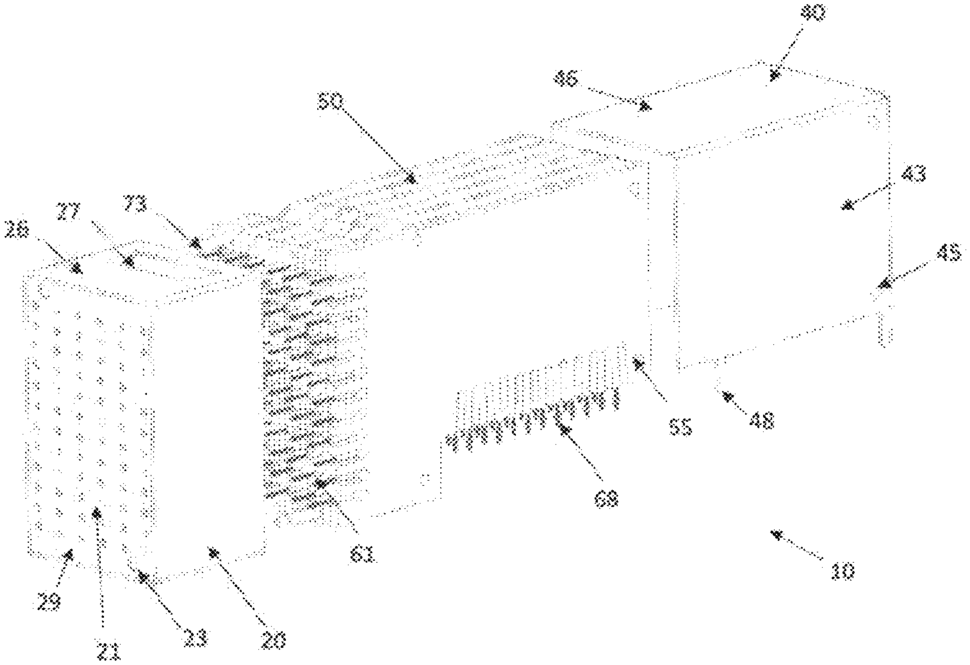
FIGS. 3A and 3B are exploded views of the single-piece backplane connector, in accordance with a first embodiment of the present invention.
Figure 3B:
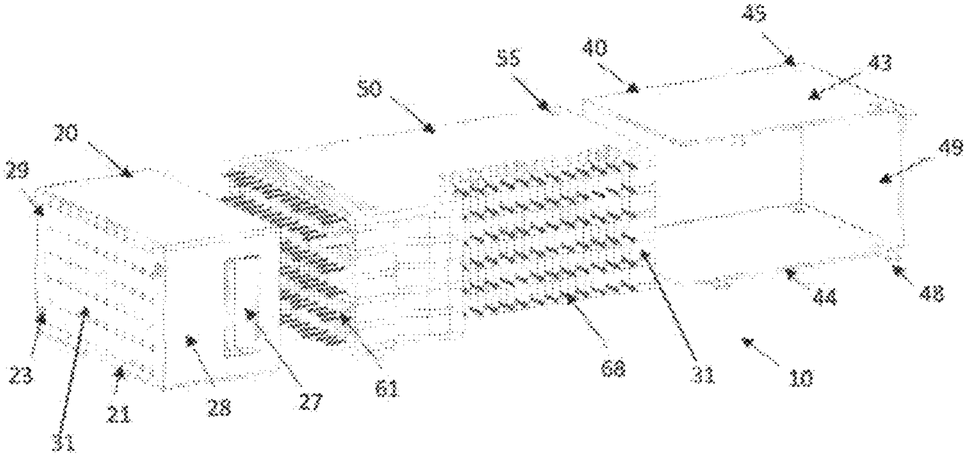

The single-piece backplane connector (10) features flat surfaces (31) on the dielectric materials which come into contact with the surfaces of the daughterboard PCB (80) and the backplane PCB (90) as seen in FIGS. 2B and 3B, in order to satisfy the "double-insulation" requirement present in ESCC specifications related to connectors destined for space-flight applications.

This invention replaces traditional two gender (male and female) mating connectors configurations where one connector is installed on the daughterboard PCB (80) and its counterpart connector is installed on the backplane PCB (90). Therefore, the single-piece connector (10), consists of one single part number instead of two distinct part numbers. The main advantage is that the high-speed signal is maintained in superior quality through the transmission line within the connector since this invention eliminates the insertion point created by the interface between the two gender connectors.

A second embodiment of the present invention will be described in the following paragraphs. For the second embodiment, the contact terminations on both sides of the connector are employing a specific interface design between connector and PCBs, known as Slide-Fit Electrical Contact Termination Technology based on U.S. Provisional Application No. 63/284,600, which is hereby incorporated by reference in its entirety. Component items featured with a triple digit designation are particular to the second embodiment of the invention and in some occurrences where the second and third digits of the number coincide with the first and second digit of the items described in the first embodiment, a redundant detailed description may be avoided due to similarities with the first embodiment.

Figure 9:
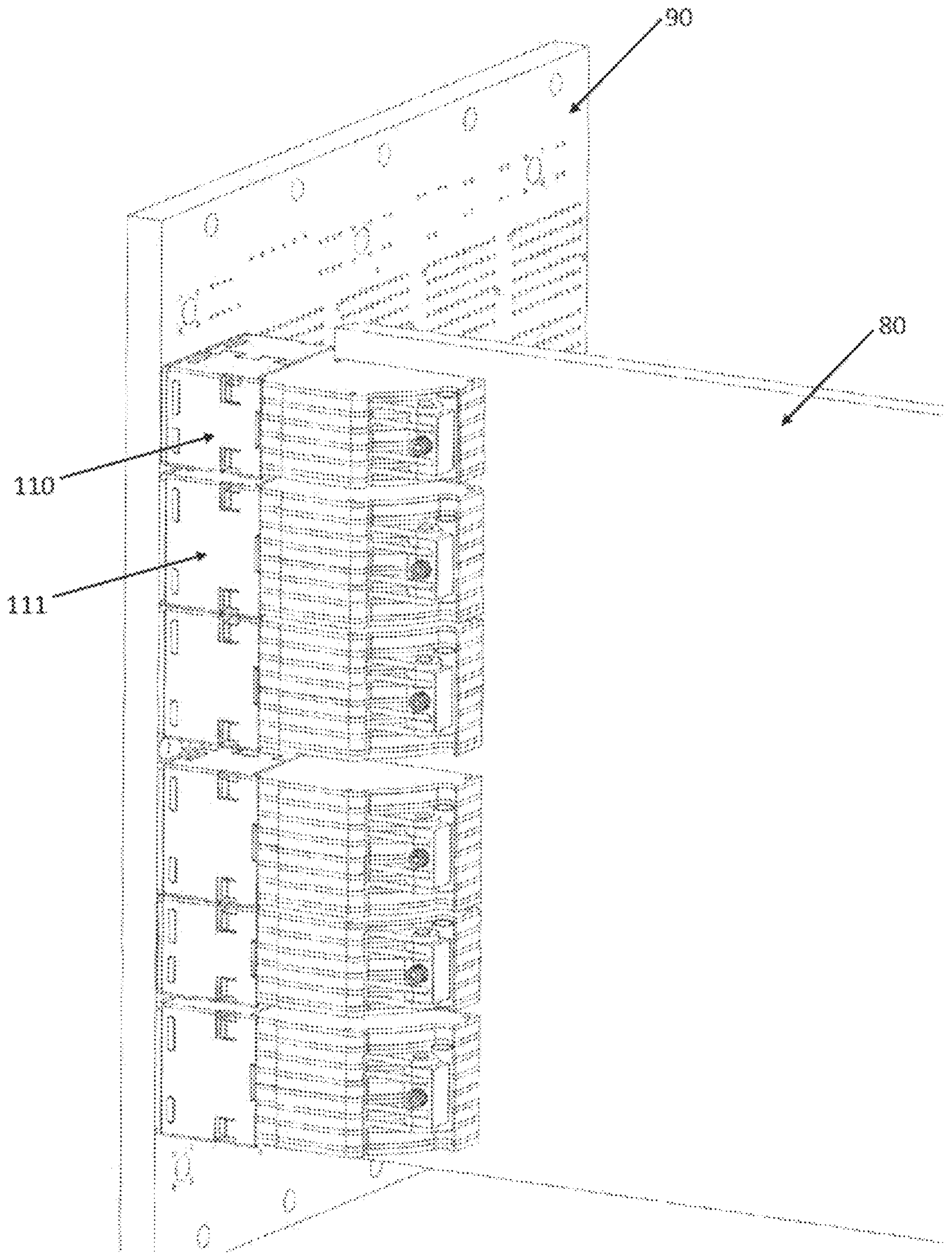
FIG. 9 is a perspective view showing exemplary six single-piece backplane connectors of two different sizes, in accordance with a second embodiment of the present invention, in a daughterboard to backplane connection system illustrating an environment in which the invention may be applied.

Similarly to the first embodiment described above, single-piece backplane connectors of the second embodiment shown installed on the daughtercard PCB (80) and plugged into the backplane PCB (90) in FIG. 9, is depicted in perspective view, showing exemplary single-piece backplane connectors of two different sizes, three single-piece backplane connectors (110) with 6 rows of contacts which appear narrower in the image, and three single-piece backplane connectors (111) with 8 rows of contacts which appear wider in the image.

Figure 10A:
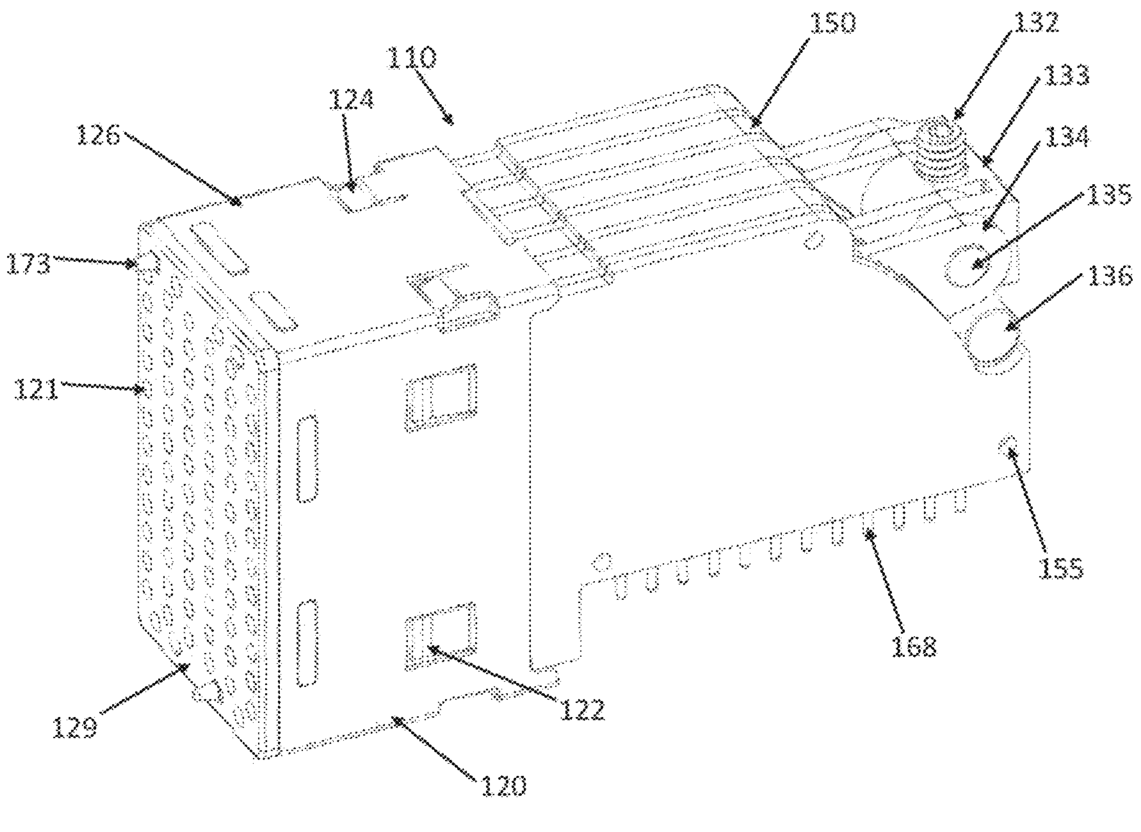
FIGS. 10A, 10B and 10C are perspective views of the single-piece backplane connector in accordance with the second embodiment of the present invention, in unmounted position, where only the pins on the daughterboard side are visible and the pins on the backplane side are hidden by the protective cover.
Figure 10B:
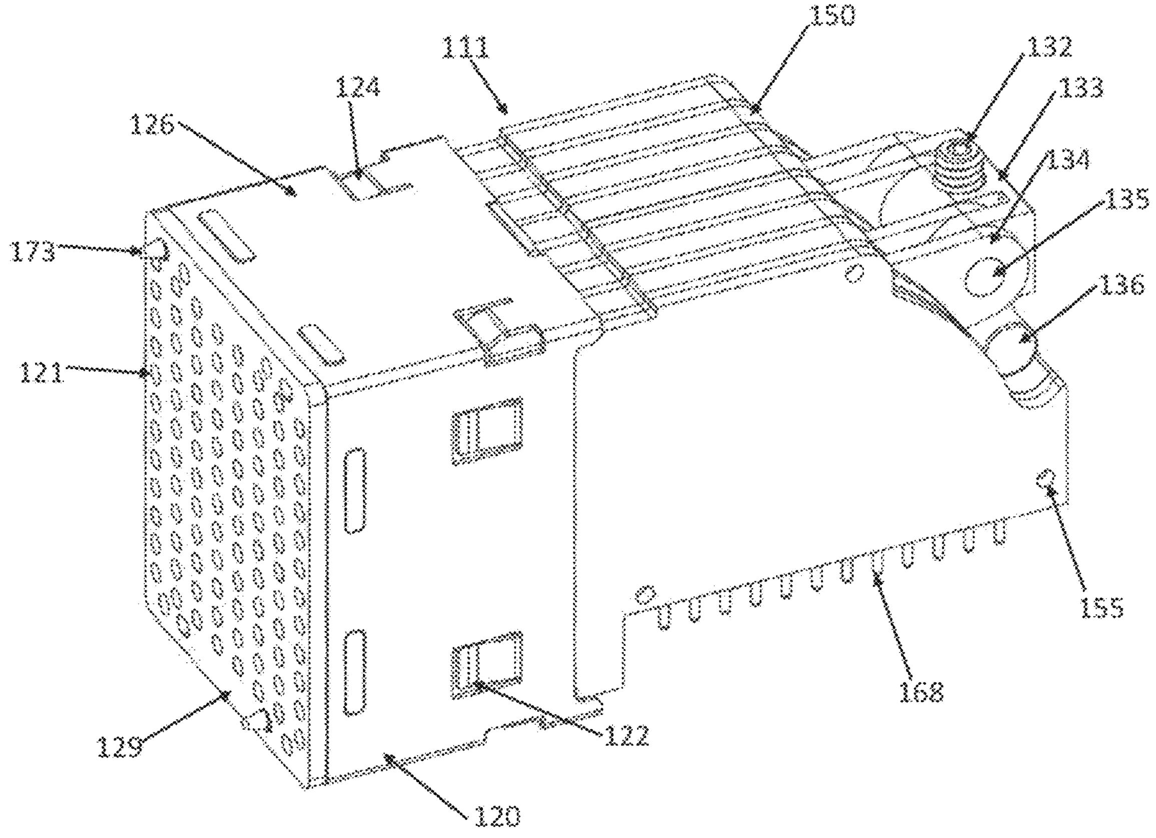

In FIGS. 10A and 10B the single-piece backplane connectors (110) and (111) are shown in perspective view in unmounted and unmated position and several of their features are different from the single-piece backplane connector (10), however the overall function of the devices remains the same as that of the first embodiment. The notable differences are the absence of the EMI shielding housing (40) which for the second embodiment is incorporated into the staggered body assembly (150) and the presence of an integrated locking and offsetting system for the connection with the daughterboard. This offsetting system comprised at least four locking levers (134), at least one locking hinge (133), at least one locking screw (132) and at least one hinge pin (135) which attaches the hinge to the levers and at least one locking screw base (136) which offers positioning and support for the locking screw (132) when the locking and offsetting systems are activated. Further differences related to the blind-mating operation of the connectors (110) and (111) with the backplane PCB (90) are not visible in these two figures but shall be described in continuation.

Figure 10C:
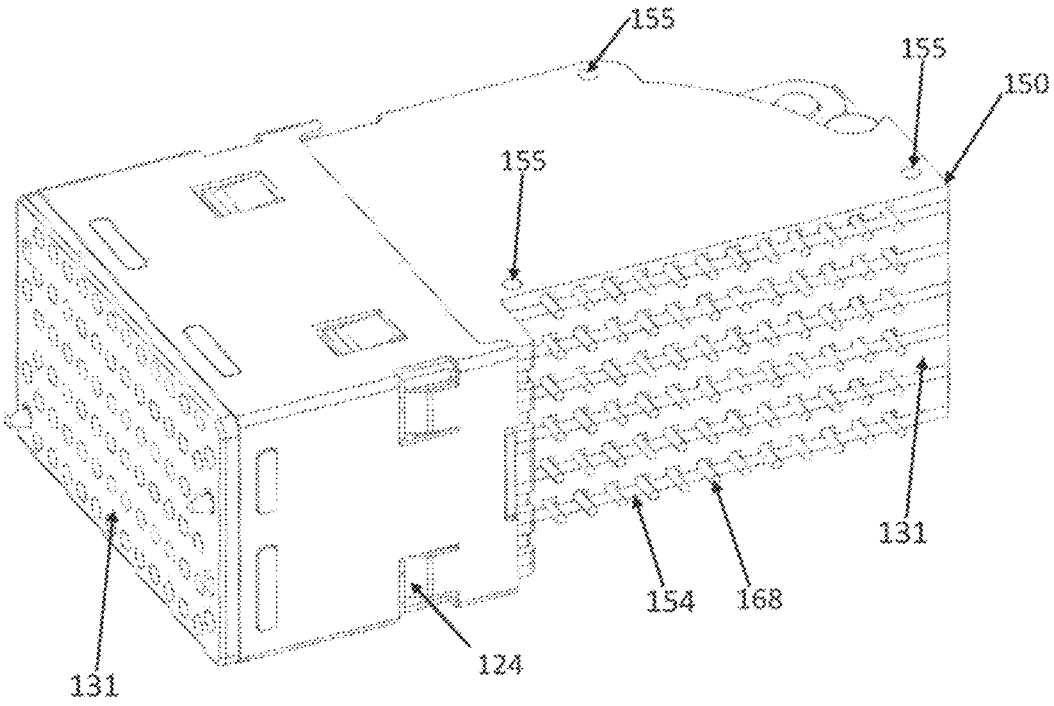

FIG. 10C is a view from a different perspective which makes visible the flat dielectric surfaces (131) which come into contact with the surface of the backplane PCB (90) on the front of the connector and the surface of the daughterboard PCB (80) on the bottom of the connector in conformance with the "double-insulation" requirement present in ESCC specifications related to connectors destined for space-flight applications. At least three installation orifices (155) are provided into the design to support the final mounting of the staggered body assembly (150). A plurality of slide-fit contacts (168) protrudes from the bottom (154) of the staggered body assembly (150).

Figure 11A:
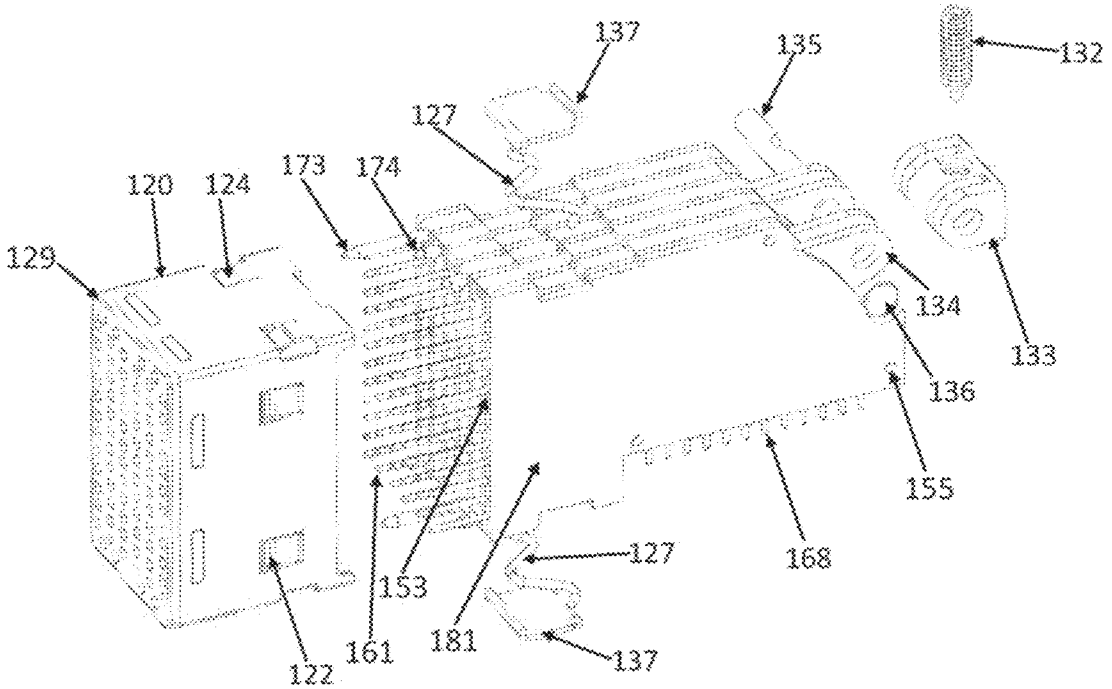
FIGS. 11A and 11B are exploded views of the single-piece backplane connector, in accordance with the second embodiment of the present invention.
Figure 11B:
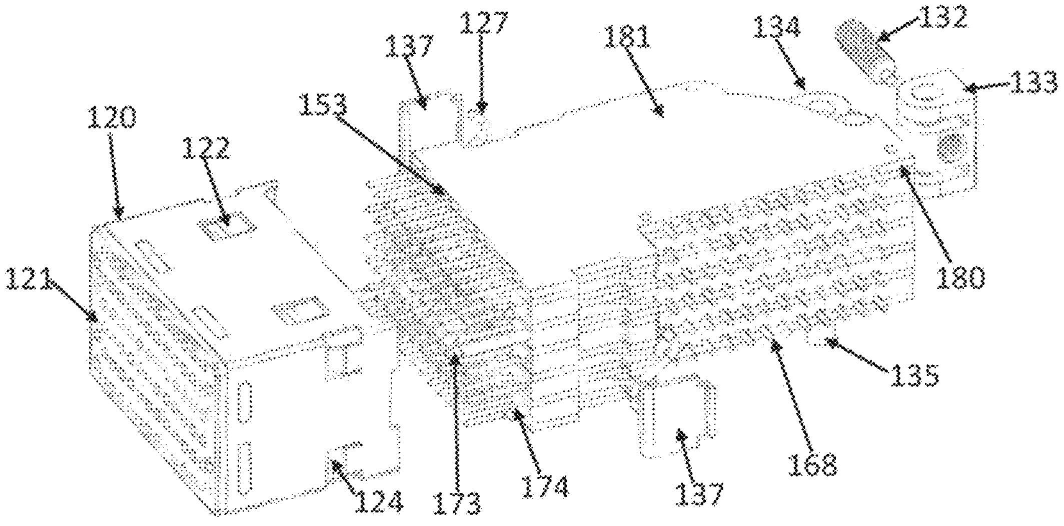

FIGS. 11A and 11B are exploded views of the single-piece connector (110) showing a protective slide-fit cover (120) comprising one or more grounding tabs (122). When fully installed, the grounding tabs (122) provide electrical connection between the protective cover (120) and a ground plane (181) laminated on an end spacer (180), shown in more detail in FIG. 12D. Preferably, the protective slide-fit cover (120) is manufactured from a conductive copper alloy. At least two guide pins (173) and at least two offset pins (174) are installed into a front face (153) of the staggered body assembly (150). Preferably, as illustrated in this embodiment, the offset pins (174) are four offset pins (174). A plurality of slide-fit contacts (161) protrudes from the face (153) of the staggered body assembly (150).

Figure 12A:
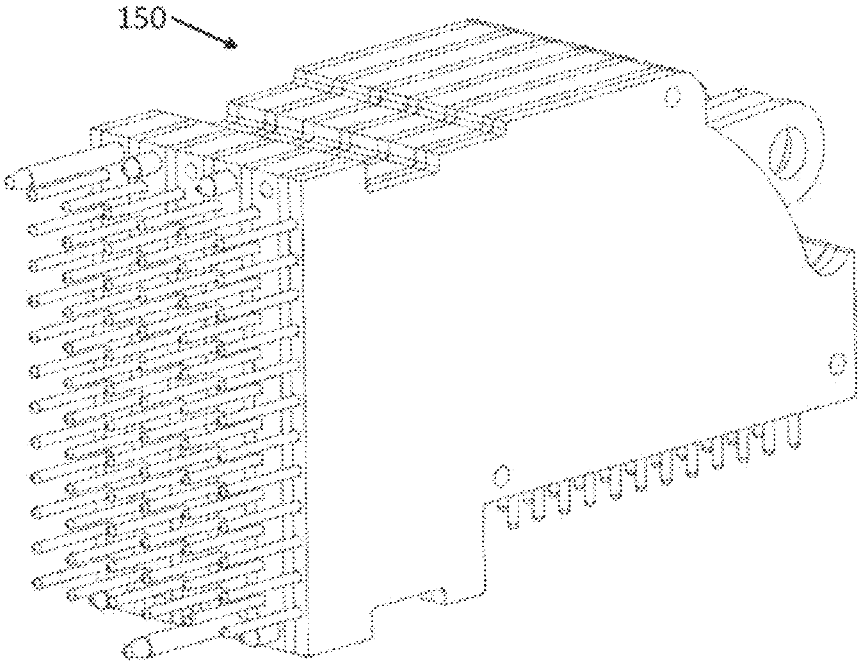
FIG. 12A is a perspective view of the staggered body assembly of the single-piece backplane connector, in accordance with the second embodiment of the present invention.
Figure 12B:
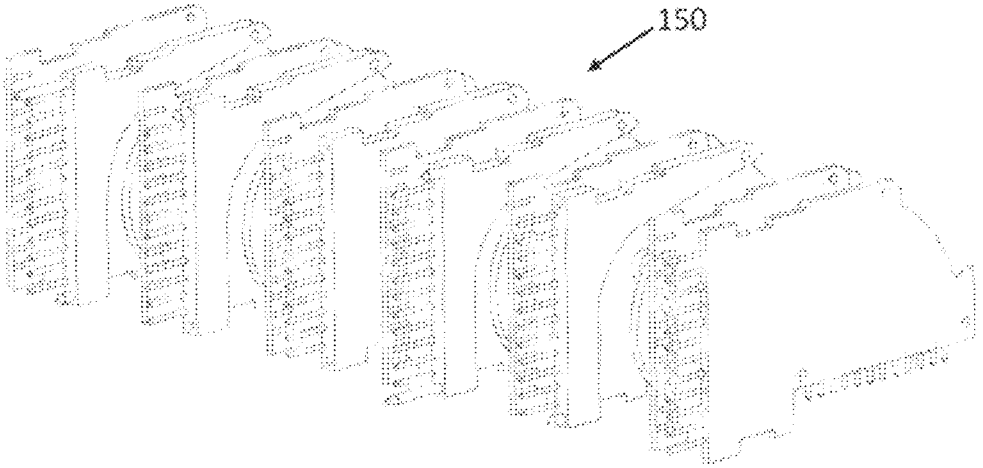
FIG. 12B is an exploded view of the staggered body assembly of the single-piece backplane connector, in accordance with the second embodiment of the present invention taken from an angle looking towards the side mating with the backplane.
Figure 12C:
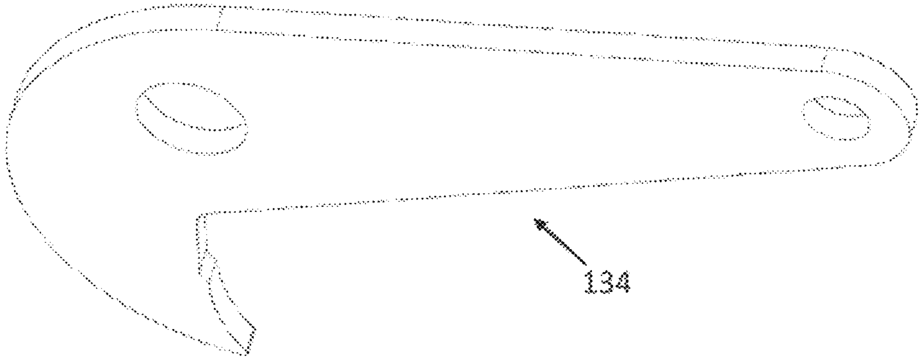
FIG. 12C is a perspective view of one exemplary locking lever of the staggered body assembly of the single-piece backplane connector, in accordance with the second embodiment of the present invention.
Figure 12D:
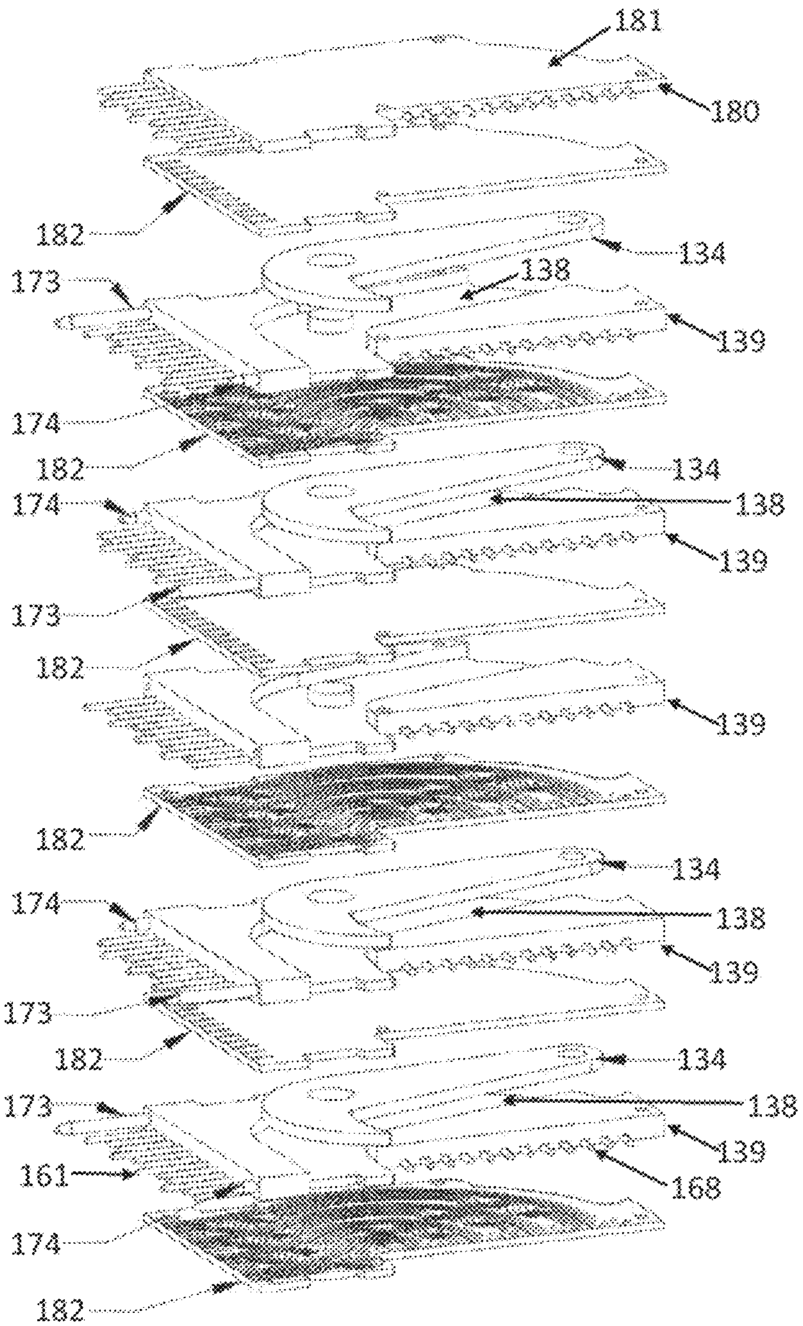
FIG. 12D is an exploded view of the staggered body assembly of the single-piece backplane connector, in accordance with the second embodiment of the present invention taken from an angle looking towards the side mating with the daughterboard.

The staggered body assembly (150) of the second embodiment of the single-piece backplane connector is shown assembled in FIG. 12A and disassembled in FIG. 12B, while FIG. 12C shows one exemplary locking lever (134) which is positioned in at least four locations within the staggered body assembly (150) of the single-piece backplane connectors. In FIG. 12D, the detailed configuration of the assembly is shown to demonstrate the unique characteristics of the assembly due to the specific order of the stacked configuration starting from the bottom up with a PCB (182) which contains internally at least two layers of traces and one ground plane, followed by the superimposition of a dielectric spacer (139) which contains at least one ground plane embedded internally and features precise micro-channels routed on its bottom side, as seen in the figure, to house the slide-fit contacts (161) and (168), and on the top side it features a routed housing (138) designed to allow space for the location of the locking lever (134). The stacking order continues with the placement of another PCB (182), followed by another spacer (139) and lever (134) and so on, until the end of the stack. At this end, a special end spacer (180) has an embedded ground plane (not shown) and an external ground plane (181) laminated on its outer surface. As exemplary illustrated, in this staggered assembly (150), some of the dielectric spacers (139) can be fitted with at least one guide pin (173), some of the dielectric spacers (139) can be fitted with at least one offset pin (174) and some of the dielectric spacers (139) can be fitted with one offset pin (174) and one guide pin (173).

Figure 13A:
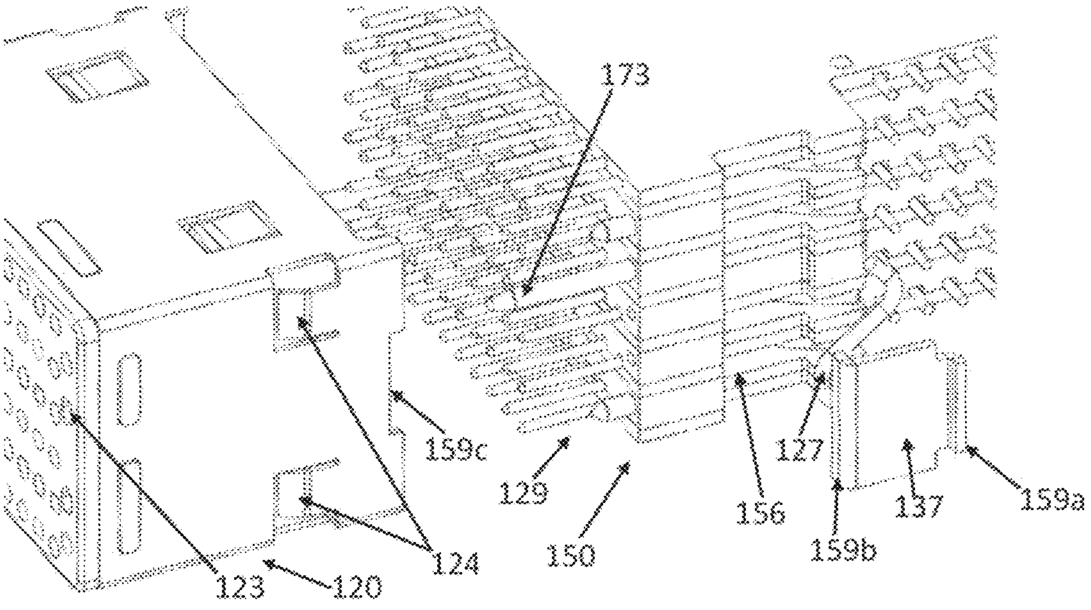
FIG. 13A is a portion of an exploded view showing a spring mechanism of the protective cover used in the second embodiment of the present invention.
Figure 13B:
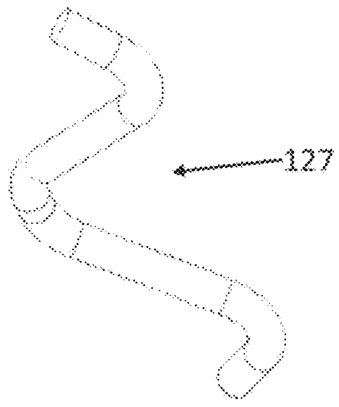
FIG. 13B is a magnified perspective view of a return spring.

As depicted in FIG. 13A, once the staggered body assembly (150) is fully completed, the protective slide-fit cover (120) is installed by sliding it over the front face (153) of the staggered body assembly (150) by obtaining alignment between at least two oval guide orifices (123) with the at least two guide pins (173). As the protective cover (120) is being installed, a return spring (127) and a spring clip (137) must be held within a return spring housing (156) on each of both opposite sides of the staggered body assembly (150) as an overlapping cutout (159*c*) slides over the spring clip (137) trapping within the return spring housing (156) both the return spring (127) and the spring clip (137). As the overlapping cutout (159*c*) reaches to a spring clip external fold (159*a*) and accommodates the spring clip external fold (159*a*), one or more locking tabs (124), which are folded inwards, will lock the protective cover (120) in place by snapping inside the return spring housing (156). The return spring (127) is thereby being held captive by the spring clip which also applies and receives the pressure onto an internal fold (159*b*). The described spring mechanism is duplicated on the directly opposite side of the body assembly (150) as seen in FIGS. 13A and 13B. The return spring (127) is shown in perspective view in FIG. 13B.

Figure 14A:
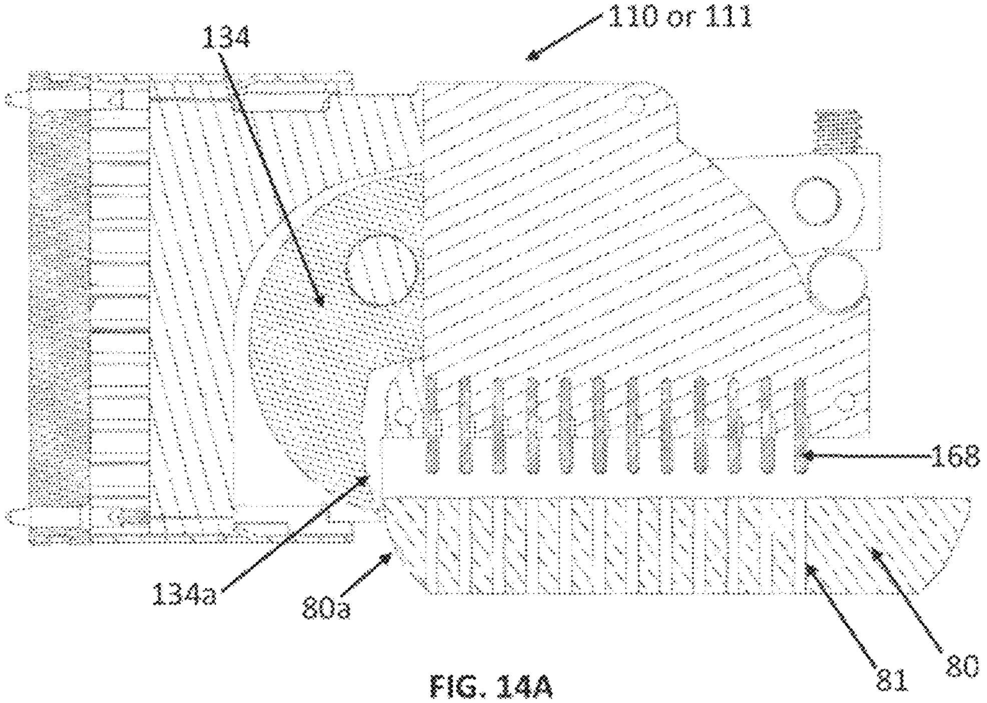
FIG. 14A is a cross-section view showing the second embodiment of the single-piece connector aligned with the footprint of the daughterboard PCB in the first step of the installation sequence of the connector onto the respective printed circuit board.
Figure 14B:
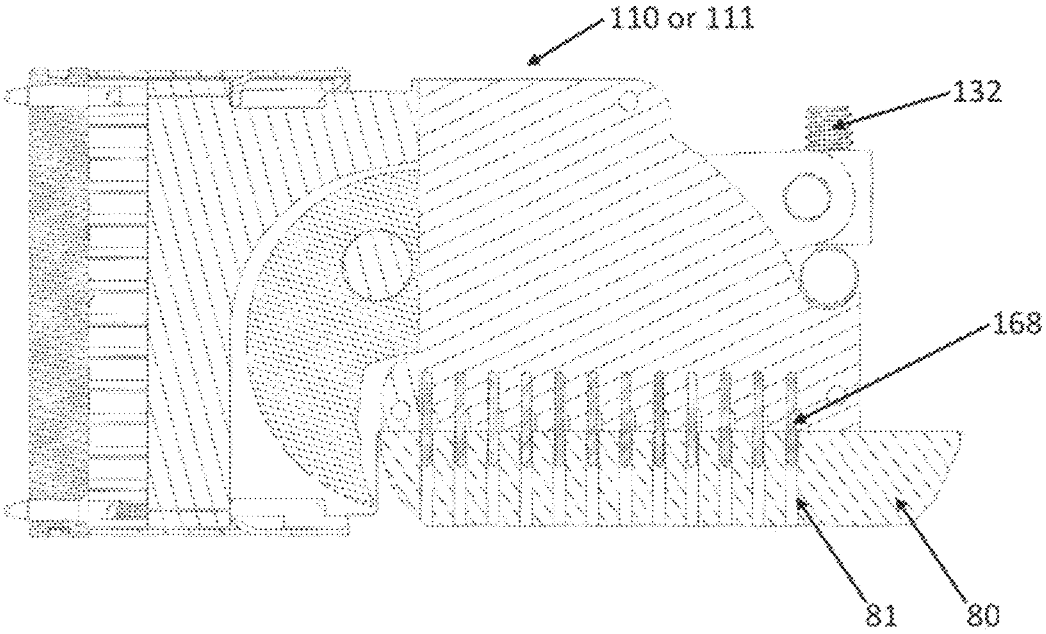
FIG. 14B is a cross-section view showing the second embodiment of the single-piece connector inserted into the daughterboard PCB footprint without any resistance or installation tools, as the second step of the installation sequence of the connector onto the respective printed circuit board.
Figure 14C:
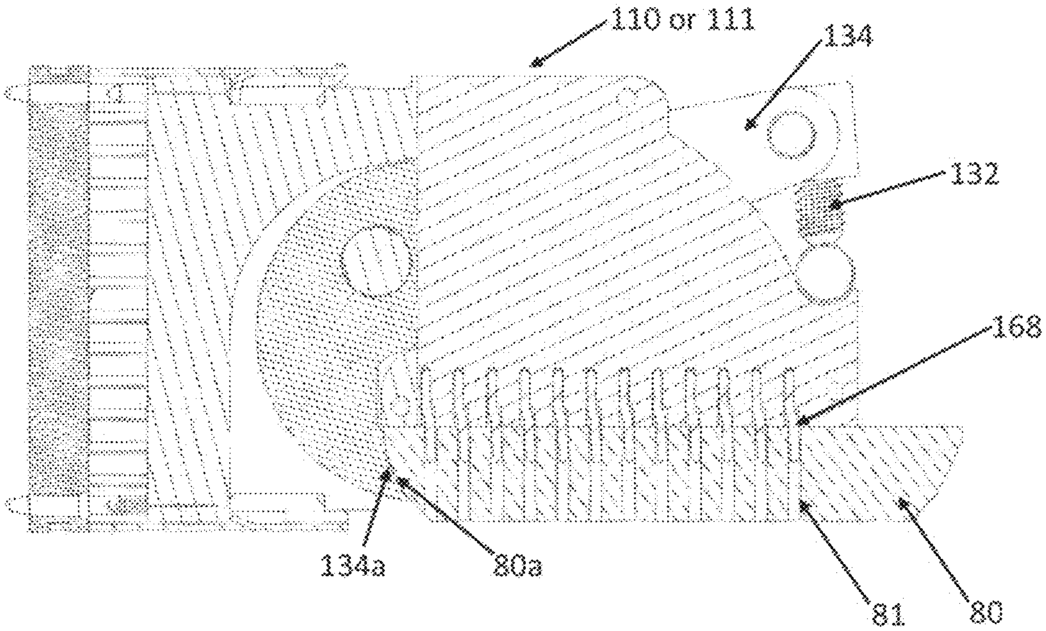
FIG. 14C is a cross-section view showing the second embodiment of the single-piece connector inserted and locked into the daughterboard PCB footprint, an action achieved by the activation of the locking screw, as the third and last step of the installation sequence of the connector onto the respective printed circuit board.

The installation onto the daughterboard PCB (80) of either single-piece backplane connector (110, 111) is similar and is shown on FIGS. 14A to 14C. The requirement for the daughterboard PCB (80) is to feature a rounded edge (80*a*) on the side where the connectors are mounted. The rounded edge (80*a*) is accomplished by a precise secondary operation of routing with a radius whose center is positioned on the top surface of the daughterboard PCB (80), the surface which comes in contact the connector. The resulting rounded edge (80*a*) on the daughterboard PCB (80) corresponds with the same curvature as a tip curvature (134*a*) of the locking lever (134). The purpose of the coincidental curvature design between the rounded edge (80*a*) and the tip curvature (134*a*) is to permit the same part numbers of connectors (110) or (111) to be installed on daughterboard PCBs (80) of various thickness dimensions, preferably from 1.60 mm thickness and greater.

In FIG. 14A the first step of the installation process is shown where the single-piece backplane connector (110, 111) is simply visually lined-up with the footprint on the daughterboard PCB (80). The metallized plated through holes (81) are shown lined-up with the slide-fit contacts (168). As depicted in FIG. 14B, the connector is simply dropped into position until slide-fit contacts (168) fully enter the plated through holes (81). Since the outer diameter of slide-fit contacts (168) is slightly smaller than the inner diameter of the plated through holes (81), the insertion is achieved without any resistance therefore no specific insertion tools are required to accomplish the positioning of single-piece backplane connector (110, 111) into daughterboard PCBs (80) of any thickness. Note that the tips of slide-fit contacts (168) do not protrude through the opposite side of the daughterboard PCB (80). Once the single-piece backplane connector (110, 111) is properly in position, the locking screw (132) must be turned clockwise continuously until the lever tip curvature (134*a*) makes contact with the rounded edge (80*a*) of the daughterboard PCB (80), and as the locking screw (132) continues to be turned clockwise until the locking lever (134) reaches its maximum "locked" position and consequently the entire connector is pushed towards the left as shown in FIG. 14C. The position displacement achieved by the full activation of the locking lever (134) results in offsetting the slide-fit contacts (168) which work within the clastic deformation characteristic of the base material from which they are manufactured and thereby achieving a reliable electrical connection via the Slide-Fit Electrical Contact Termination interface technology as described on the U.S. Provisional Application No. 63/284,600 which is hereby incorporated by reference in its entirety. The fully locked configuration shown in FIG. 14C demonstrates a novel installation method which achieves full separation of the mechanical locking of the single-piece backplane connector (110, 111) to the daughterboard PCB (80) from the electrical function achieved between the slide-fit contacts (168) and the plated through holes (81) of the daughterboard PCB (80).

Referring to FIG. 9, single-piece backplane connectors (110) and (111) are shown plugged into the backplane PCB (90). In the following paragraphs the blind mating process is described including the functions of each of the corresponding components.

The protective slide-fit cover (120) contains a dielectric offsetting plate (195) shown in FIGS. 15A to 15D. The dielectric offsetting plate (195) include a plurality of slide-fit contact orifices (121). As shown magnified in FIG. 15D, the cavity profile of the slide-fit contact orifices (121) is conformed by two opposing conical sections which are elastic deformation zones (121*a*) for the slide-fit contacts (161). In the illustrated embodiment, the dielectric offsetting plate (195) contains two other types of orifices designed for different functions, the at least two oval guide orifices (123) for the blind mating guide pins (173), and at least four offset guiding orifices (194) for the offset pins (174).

When the daughterboard PCB (80), on which single-piece backplane connectors (110) and (111) are installed, is blind-mated with the backplane PCB (90) as shown in FIG. 9, the single-piece backplane connectors (110) and (111) must have the ability to self-align properly such that the blind-mating operation is executed properly and a good electrical connection is achieved between corresponding electrical positions on daughterboard PCB (80) and backplane PCB (90).

Figure 15A:
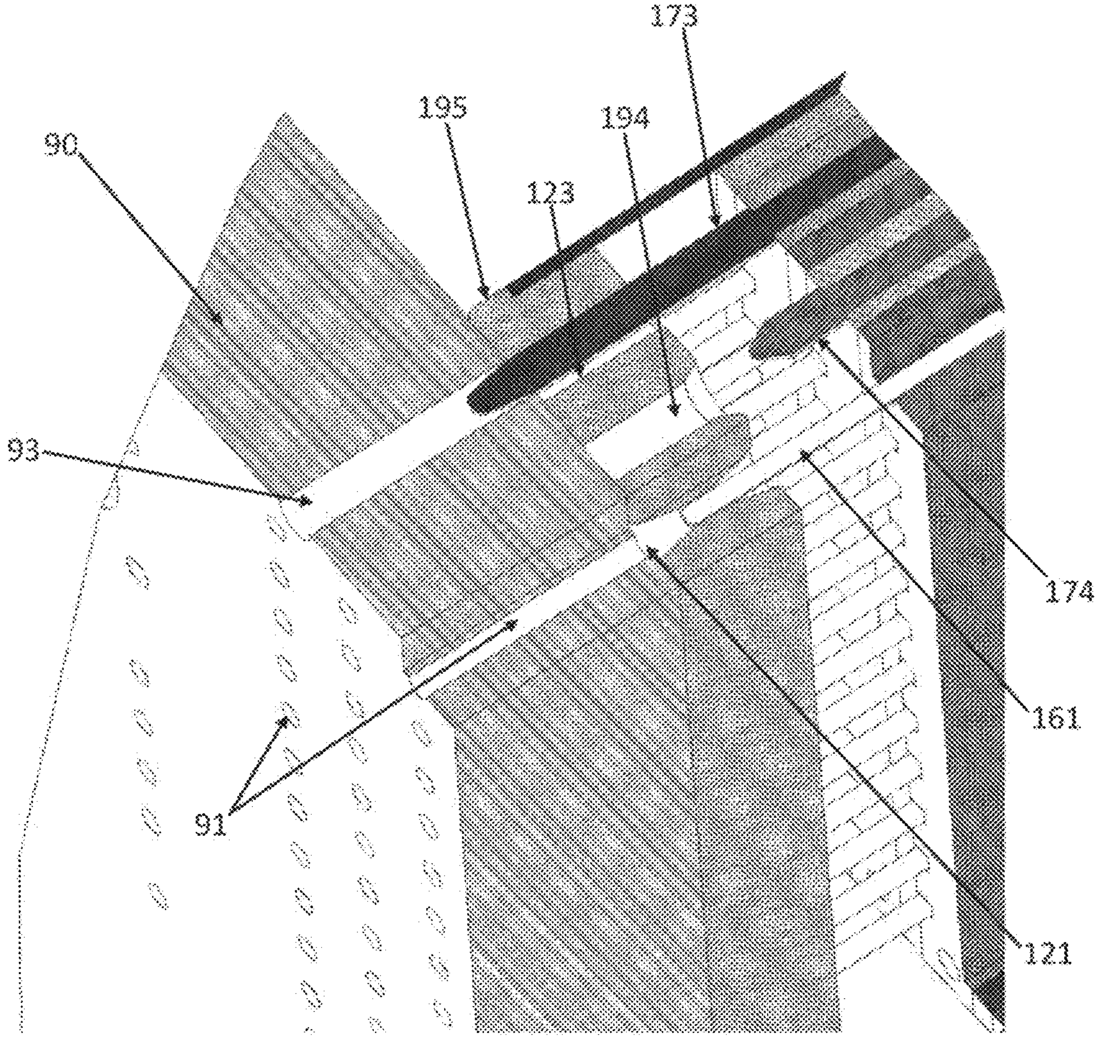
FIG. 15A is a perspective view of a cross-section showing the first step in the blind-mating operation between the second embodiment of the single piece connector and the backplane PCB.

FIGS. 15A, B and C show a multi-level cross sectional view of the backplane PCB (90), the dielectric offsetting plate (195), the guide pin (173) and the offset pin (174) in such detail which permits to describe the operation of the process.

Figure 15B:
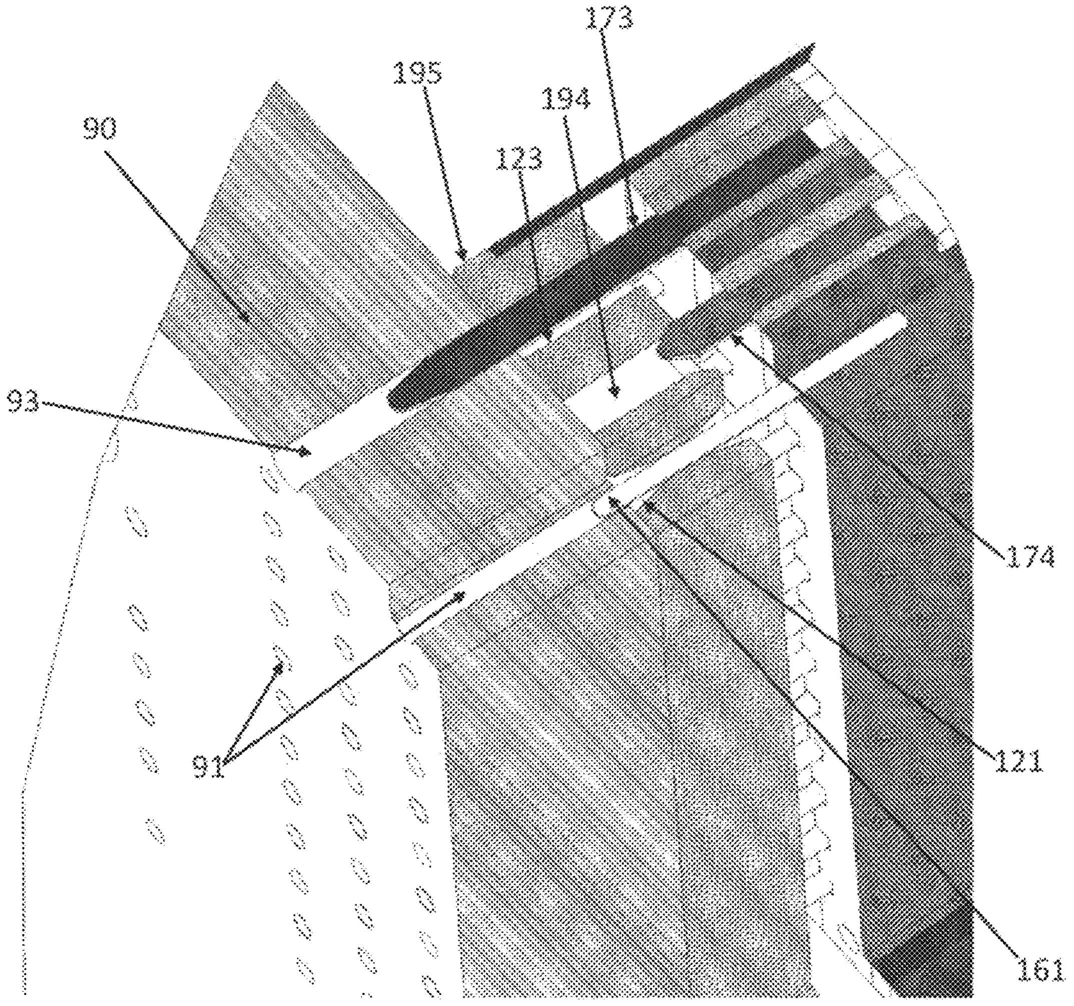
FIG. 15B is a perspective view of a cross-section showing the second step in the blind-mating operation between the second embodiment of the single piece connector and the backplane PCB.

As depicted in detail in FIG. 15A, during the blind-mating process, the alignment of the dielectric offsetting plate (195), with the backplane PCB (90) is achieved when the conical section tips of the guide pins (173), find the guiding orifices (93) in the backplane PCB (90) and align the plurality of orifices (121) which house the slide-fit contacts (161) with the plurality of metalized plated through holes (91) of the backplane PCB (90). When alignment is achieved as shown in FIG. 15A, the continuation of the plugging action allows the plurality of contacts (161) to advance and start penetrating the plated through holes (91) in the corresponding positions as shown in FIG. 15B. The depth of penetration of contacts (161) into the plated through holes (91) is sufficient to ensure the correct alignment of the connector at the point where the offset pins (174) start to make contact with the offset guiding orifices (194) from the dielectric offsetting plate (195). It is important to note that the offset pins (174) and the offset guiding orifices (194) are not in alignment but they are positioned slightly off from each other yet the conical tip of the offset pin (174) is fully positioned into the conical portion of the offset guiding orifice (194) of the dielectric offsetting plate (195). As the plugging action continues its travel towards achieving the fully mated condition shown in FIG. 15C, the offset pins (174), as they advance, they force the dielectric offsetting plate (195) to slightly move sideways perpendicularly to the longitudinal axis of the slide-fit contacts (161). The sideways motion of the dielectric offsetting plate does not disturb the alignment between the guide pins (173) and the backplane PCB (90) because the oval guide orifices (123) permit the offsetting to take place without disturbing the alignment of the daughterboard PCB (80) with the backplane PCB (90) as shown in FIG. 9.

Figure 15C:
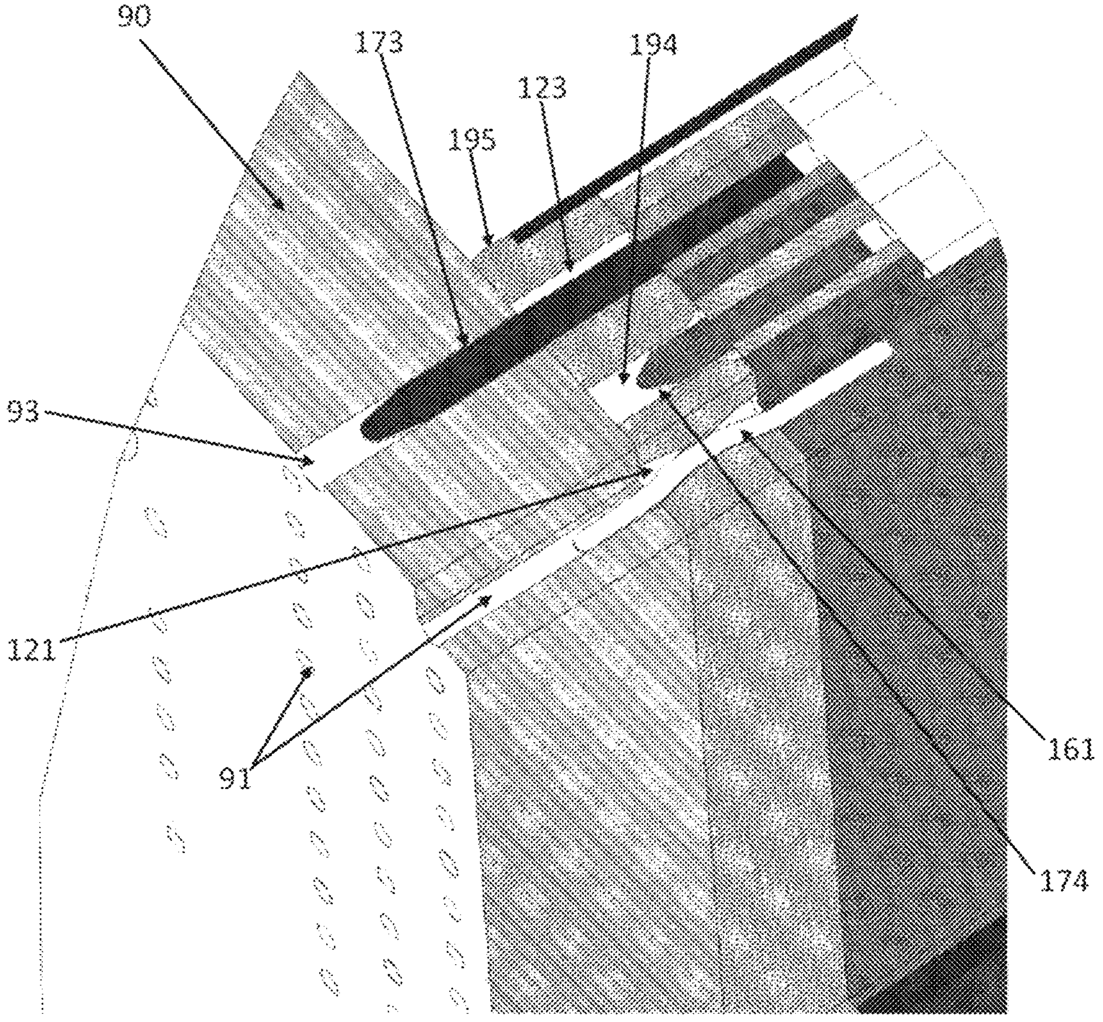
FIG. 15C is a perspective view of a cross-section showing the third and last step in the blind-mating operation between the second embodiment of the single piece connector and the backplane PCB.
Figure 15D:
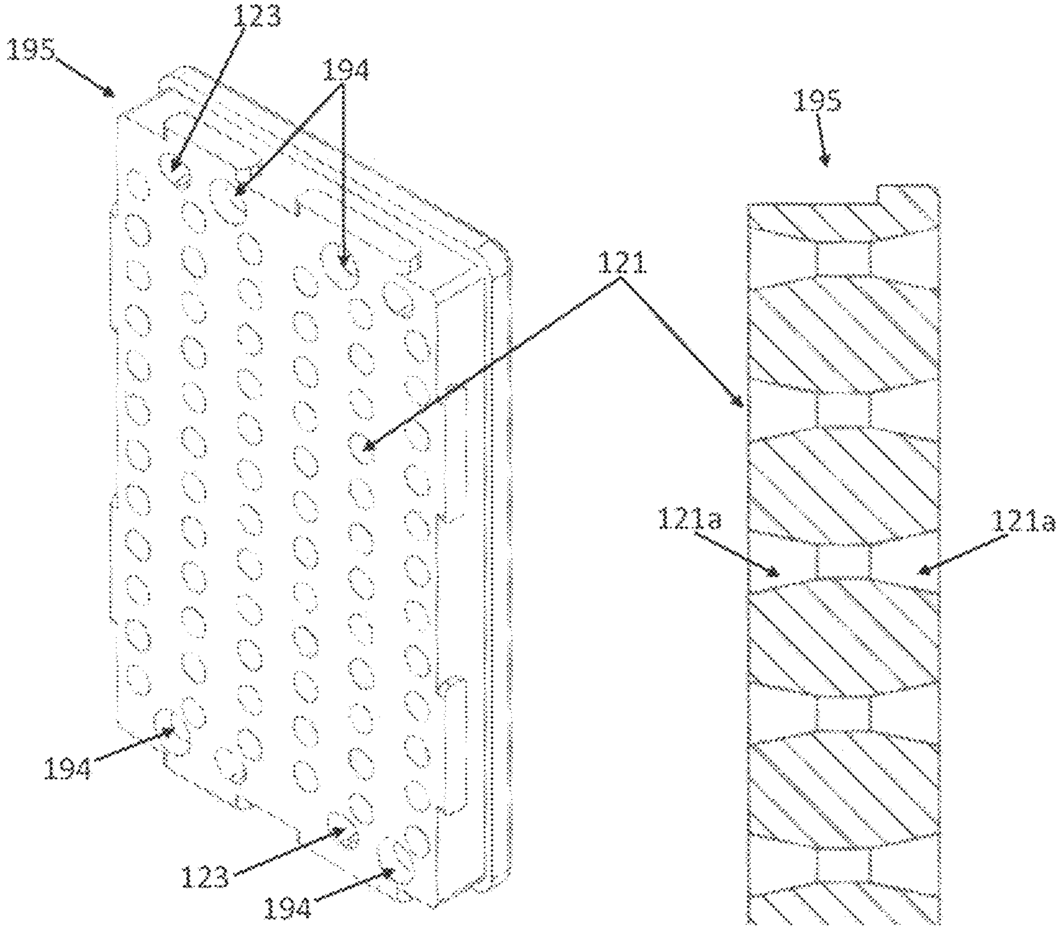
FIG. 15D shows on the left a perspective view of the dielectric portion of the protective slide-fit cover and on the right, it shows a magnified cross-section through the center of the cavities designed to achieve the offset for the slide-fit contacts.

In FIG. 15C the full mated condition is depicted and the most important aspect is that the slide-fit contact (161) is slightly deformed before the elastic deformation limit of the material is reached such that a good electrical connection is achieved between the slide-fit contact's (161) body and the metalized plated through hole (91) of the backplane PCB (90). The details of operation of the specific electrical interface design between the slide-fit contact (161) and the backplane PCB (90), known as Slide-Fit Electrical Contact Termination Technology, is based on U.S. Provisional Application No. 63/284,600, which is hereby incorporated by reference in its entirety.

The overall configuration of a single-piece backplane connector (110, 111) as described in the second embodiment of this invention offer significant advantages when compared to similar connector products which employ press-fit contact terminations at the interface with PCBs. Press-fit terminations are more damaging to PCBs whereas this invention permits multiple reuses of the same connectors as they do not wear the plating on the surfaces of the interfacing contacts, and they do not wear the plating on the surfaces of the plated through holes in the PCB.

The single-piece connector configuration which mates directly with the footprint into a backplane PCB substitutes two different part numbers with one single part number therefore effectively reducing the total cost.

Furthermore, the employment of slide-fit contact termination technology eliminates the need to employ pressing tools and support tools which are required for connectors with press-fit terminations. From the standpoint of signal integrity in high data rate applications, the elimination of an insertion point in the transmission line increases the transfer rate capabilities of the connectors. From an electrical standpoint, the elimination of an insertion point results in the reduction of the total resistance for each line therefore increasing the efficiency of the device.

The ability of the single-piece connector to fully separate the mechanical function of the installation from the electrical function of the contacts, permits the use of such device in harsh environment applications.

In the interface mechanism between the contacts and the plated through holes in the backplane, the electrical function of the connection is also separated from the mechanical function because the mechanical pressure of interface is achieved by the perpendicular force applied on the longitudinal axis of the contacts by the offsetting plate which is held in offset position by the inner offset pins which are manufactured preferably from hard tungsten carbide material to resist shearing forces in applications where high shock and vibration environments are present.

Although the foregoing embodiments have been described in some detail for purposes of clarity of understanding, the invention is not limited to the details provided. There are many alternative ways of implementing the invention. The disclosed embodiments are illustrative and not restrictive.

The invention claimed is:

1. A single-piece backplane connector mating its front end with a backplane PCB, and mating its bottom with a daughterboard PCB, wherein the backplane PCB and daughterboard PCB comprise a plurality of plated through holes;

the single-piece backplane connector comprises a protective cover slidably attached over a staggered body assembly; and the single-piece backplane connector is characterized in that:

the protective cover comprises a plurality of contact orifices to permit the path through of a corresponding plurality of pin contacts located in a front portion of the staggered body assembly, and at least two guide orifices to permit the path through of at least two corresponding guide pins located in the front portion of the staggered body assembly;

the staggered body assembly comprises a plurality of alternating PCB layers and dielectric spacers, wherein the PCB layers include a plurality of traces, wherein each trace electrically connects each of the pin contacts on the front end with a corresponding pin contact on the bottom mating with the corresponding plurality of plated through holes in the daughterboard PCB; and wherein the protective cover further comprises a return spring mechanism to slide from an unpressed position to a pressed position, and the protective cover slides towards the staggered body assembly to permit the pin contacts to protrude through the orifices and to mate with the corresponding plurality of plated through holes in the backplane PCB.

2. The single-piece backplane connector in accordance to claim 1, wherein the single-piece backplane connector features flat surfaces with the surfaces of the daughterboard PCB and the backplane PCB.

3. The single-piece backplane connector in accordance to claim 1, wherein the single-piece backplane connector further comprises an EMI shielding housing fixed to a rear portion of the staggered body assembly.

4. The single-piece backplane connector in accordance to claim 3, wherein the EMI shielding housing comprises:

a top surface, a rear wall, and two lateral walls; and wherein each of the lateral walls is extended into the daughterboard side by at least one shield tail and at least one installation orifice.

5. The single-piece backplane connector in accordance to claim 1, wherein the contact orifices are conformed by a cylindrical portion in the front face of the protective cover and a conical portion in the rear face of the protective cover.

6. The single-piece backplane connector in accordance to claim 1, wherein the plurality of pin contacts mating into the daughterboard is configured in an alternating offset arrangement.

7. The single-piece backplane connector in accordance to claim 1, wherein the dielectric spacers comprise a plurality of slots, wherein each slot corresponds to the position of each pin contact.

8. The single-piece backplane connector in accordance to claim 1, wherein at least two of the dielectric spacers can be fitted with at least one guide pin.

9. The single-piece backplane connector in accordance to claim 1, wherein the pin contacts have a twist pin contact configuration.

10. The single-piece backplane connector in accordance to claim 1, wherein the return spring mechanism comprises an integrated spring clip to interact with a top and bottom groove of the staggered body assembly.

11. The single-piece backplane connector in accordance to claim 1, wherein the staggered body assembly further comprises an offsetting system including:

at least four locking levers, at least one locking hinge, at least one locking screw, and at least one hinge pin which attaches the hinge to the levers; and wherein at least one locking screw base to support the locking screw.

12. The single-piece backplane connector in accordance to claim 11, wherein the daughterboard PCB comprises a rounded edge corresponding with a tip curvature of the locking lever.

13. The single-piece backplane connector in accordance to claim 11, wherein the staggered body assembly is configurated in a stack assembly comprising:

one PCB layer including at least two layers of traces and one ground plane; followed by one dielectric spacer including at least one ground plane embedded internally, the dielectric spacer comprises micro-channels routed on its bottom side to house the pin contacts, and on the top side the dielectric spacer further comprises a routed housing to receive the locking lever; and wherein the stack assembly configuration continues with another PCB layer, followed by another dielectric spacer until the end of the stack.

14. The single-piece backplane connector in accordance to claim 13, wherein the staggered body assembly comprises at its end a special end spacer comprising an embedded ground plane and an external ground plane laminated on its outer surface.

15. The single-piece backplane connector in accordance to claim 1, wherein one or more of the dielectric spacers comprise either of at least one guide pin, at least one offset pin, or one offset pin and one guide pin.

16. The single-piece backplane connector in accordance to claim 1, wherein the protective cover further comprises a dielectric offsetting plate.

17. The single-piece backplane connector in accordance to claim 16, wherein the dielectric offsetting plate comprises a plurality of slide-fit contact orifices, at least two oval guide orifices, and at least four offset guiding orifices, wherein each offset guiding orifice receive an offset pin.

18. The single-piece backplane connector in accordance to claim 17, wherein the slide-fit contact orifices are conformed by two opposing conical sections which are elastic deformation zones for the slide-fit contacts.

19. The single-piece backplane connector in accordance to claim 1, wherein the return spring mechanism comprises a return spring and a spring clip held within a return spring housing on each of both opposite sides of the staggered body assembly as an overlapping cutout slides over the spring clip trapping within the return spring housing both the return spring and the spring clip.

20. The single-piece backplane connector in accordance to claim 19, wherein the overlapping cutout reaches to a spring clip external fold and accommodates the spring clip external fold, one or more locking tabs folded inwards to lock the protective cover by snapping inside the return spring housing.

* * * * *